(12) United States Patent
Akiyama et al.

(10) Patent No.: US 9,512,272 B2
(45) Date of Patent: Dec. 6, 2016

(54) CURABLE COMPOSITION CONTAINING SILICONE, AND CURED PRODUCT THEREOF

(71) Applicant: Central Glass Company, Limited, Ube-shi, Yamaguchi (JP)

(72) Inventors: Katsuhiro Akiyama, Saitama (JP); Yu Matsuno, Fujimino (JP); Hiroshi Eguchi, Saitama (JP); Kazuhiro Yamanaka, Tachikawa (JP); Junya Nakatsuji, Fujimino (JP); Wataru Kawai, Fujimino (JP); Tsuyoshi Ogawa, Saitama (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 14/761,763

(22) PCT Filed: Jan. 22, 2014

(86) PCT No.: PCT/JP2014/051183
§ 371 (c)(1),
(2) Date: Jul. 17, 2015

(87) PCT Pub. No.: WO2014/115742
PCT Pub. Date: Jul. 31, 2014

(65) Prior Publication Data
US 2015/0322211 A1 Nov. 12, 2015

(30) Foreign Application Priority Data

Jan. 25, 2013 (JP) .................... 2013-012062
Jan. 21, 2014 (JP) .................... 2014-008423

(51) Int. Cl.
| | | |
|---|---|---|
| C08G 77/12 | (2006.01) |
| C08G 77/08 | (2006.01) |
| C09K 3/10 | (2006.01) |
| H01L 23/29 | (2006.01) |
| C09D 183/14 | (2006.01) |
| C08L 83/06 | (2006.01) |
| C08L 83/04 | (2006.01) |
| H01L 33/56 | (2010.01) |
| C08G 77/16 | (2006.01) |
| C08G 77/20 | (2006.01) |

(52) U.S. Cl.
CPC ............ *C08G 77/12* (2013.01); *C08G 77/08* (2013.01); *C08L 83/04* (2013.01); *C08L 83/06* (2013.01); *C09D 183/14* (2013.01); *C09K 3/1018* (2013.01); *H01L 23/296* (2013.01); *C08G 77/16* (2013.01); *C08G 77/20* (2013.01); *H01L 33/56* (2013.01); *H01L 2924/0002* (2013.01)

(58) Field of Classification Search
CPC ........ C08G 77/12; C08G 77/20; C08L 83/00
See application file for complete search history.

(56) References Cited

U.S. PATENT DOCUMENTS

| | | | |
|---|---|---|---|
| 6,001,918 A | 12/1999 | Enami et al. |
| 6,001,943 A | 12/1999 | Enami et al. |
| 6,225,433 B1 | 5/2001 | Isshiki et al. |
| 7,939,614 B2 | 5/2011 | Sueyoshi et al. |
| 2006/0135687 A1* | 6/2006 | Fukui .................... C08L 83/04 524/588 |

FOREIGN PATENT DOCUMENTS

| | | | |
|---|---|---|---|
| JP | 10-212413 A | 8/1998 |
| JP | 11-29710 A | 2/1999 |
| JP | 11-181289 A | 7/1999 |
| JP | 2001-2922 A | 1/2001 |
| JP | 2005-325174 A | 11/2005 |
| JP | 2009-62446 A | 3/2009 |
| JP | 2009-215345 A | 9/2009 |
| JP | 2012-129315 A | 7/2012 |
| JP | 2012-129316 A | 7/2012 |

OTHER PUBLICATIONS

International Search Report (PCT/ISA/210) dated Apr. 1, 2014 with English-language translation (five (5) pages).
Japanese-language Written Opinion (PCT/ISA/237) dated Apr. 1, 2014 (three (3) pages).

* cited by examiner

*Primary Examiner* — Kuo-Liang Peng
(74) *Attorney, Agent, or Firm* — Crowell & Moring LLP

(57) ABSTRACT

Disclosed is a curable composition including a silicone (A) of a specific structure and a composition containing Si—OH group and Si—H group, a silicone (B) of a specific structure and a composition containing Si—OH group and Si—CH=CH$_2$ group, and a hydrosilylation catalyst of a catalytic quantity containing at least one metal compound selected from the group consisting of platinum compounds, palladium compounds, and rhodium compounds. In this curable composition, as kind of each silicone and the content of Si—OH group are adjusted, in curing the silicone, foaming in a cured product can be inhibited by inhibiting a dehydration condensation reaction between Si—OH groups, as compared with a hydrosilylation reaction which is a reaction of Si—CH=CH$_2$ group and Si—H group. Furthermore, an excellent adhesion to a base body such as semiconductor substrate can be given when making a cured film.

6 Claims, No Drawings

CURABLE COMPOSITION CONTAINING SILICONE, AND CURED PRODUCT THEREOF

The present invention relates to a curable composition containing a silicone, and a cured product thereof, which are used for a sealing material or an adhesive agent requiring a heat resisting property.

The curable composition containing a silicone, and the cured product thereof of the present invention are used for a sealing material for power semiconductor which has a high withstand voltage property using silicon carbide (SiC) or optical components, lens, optical thin films, specially a sealing material for semiconductor of light emitting diode (hereinafter it may be referred as "LED") or semiconductor laser, etc. which require transparency.

BACKGROUND OF THE INVENTION

A heat resisting property to withstand heat generation of semiconductor devices and LED in operation is required for a sealing material for semiconductor. Furthermore, transparency is also required in addition to the heat resisting property for a sealing material for semiconductor for optical components such as LED. As these sealing materials, epoxy resins or cured products prepared by curing silicones have been used. Furthermore, in the present description, "silicone" means a polymer compound having a main skeleton by siloxane bond.

However, conventional epoxy resins have insufficient heat resisting properties to be used for sealing materials for semiconductor of power semiconductor, or high-brightness light emitting elements such as a high-brightness LED for a headlight of automobile or for a backlight of liquid crystal television, or semiconductor laser, so it has been known that malfunctions such as a leakage of electric current by heat deterioration of sealing material or yellowing of sealing material occur.

Furthermore, for a sealing material for semiconductor, little transit of water to restrain a leakage of electric current or short circuit and good adhesion to substrates or light emitting elements, etc. have been required.

As a sealing material for semiconductor fulfilling such requirements, a cured product of silicone is used for a sealing material of LED. In sealing an LED with a sealing material for semiconductor, a curable composition containing a silicone as a precursor of sealing material is cured to seal. At that time, a method for curing the curable composition can be divided into the following two ways. The first method is a method that a silicone is cured by addition polymerization by hydrosilylation. The second method is a method that an alkoxysilane is heated and cured by dehydration condensation of Si—OH group (silanol group).

The first method is mainly used in using a silicone as an LED sealing material, etc. Curing by hydrosilylation reaction, which is the first method, is an addition polymerization reaction between Si—H group (hydrosilyl group) and Si—CH=CH$_2$ (vinylsilyl group) group, and molding the cured product is easy. However, in the first method, the cured product has a low heat resisting property as compared with in the second method, so it is easy to cause yellowing by a long heating.

In the second method, a cured product of silicone having a higher heat resisting property can be obtained than in the first method because a siloxane bond (Si—O—Si) is formed to bridge it by dehydration condensation between Si—OH groups (hereafter it may be just referred to as "condensation"). Furthermore, as it contains a higher content of Si—OH group, adhesion to substrates such as glass and silicon is improved. However, in the second method, there have been problems that the curable composition to make Si—OH group react at normal temperature (it is defined as approximately 20° C. in the present description) is easy to gel, so there is a fear in storage stability, and that it is easy to foam in molding curing, so curing time is longer as compared with in the first method, etc.

For example, it is reported that a silicon-containing curable composition disclosed in Patent Publication 1 has an excellent storage stability and its cured product has an excellent heat resisting property and an excellent flexibility.

Furthermore, in Patent Publication 2, it is disclosed that a silicone resin obtained by dehydration condensation of a specific alkoxysilane has a high heat resisting property. It is easy to obtain a thin film by coating a base body with the present silicone resin. However, molding a bulk body by potting process is difficult. The reason is that water is generated as a by-product in the process of dehydration condensation of Si—OH group, and foaming is generated within the bulk body before curing by the water vapor, so the foam remains within the bulk body after curing.

Furthermore, in Patent Publication 3, a sealing agent for optical semiconductor devices which has an excellent defoaming property is disclosed. The sealing agent for optical semiconductor devices described in Patent Publication 3 contains a first silicone resin (however, excepting a silicone resin having a hydrogen atom bonded to a silicon atom) that is synthesized by subjecting an alkoxysilane compound to a hydrolysis polycondensation by a base catalyst, that has an aryl group and an alkenyl group, and that is substantially free from an alkoxy group; a second silicone resin that is synthesized by subjecting an alkoxysilane compound to a hydrolysis polycondensation by an acid catalyst, that has an aryl group and a hydrogen atom bonded to a silicon atom, and that is substantially free from an alkoxy group; and a catalyst for hydrosilylation reactions. In obtaining a silicone resin as a raw material of the sealing material by condensation of an alkoxysilane while using an acid or a base as a catalyst for hydrosilylation reaction, the alkoxysilane contained in the silicone resin is reduced as much as possible by adding a monofunctional alkoxysilane such as trimethylmethoxysilane. Thereby, in curing the sealing agent for optical semiconductor devices, foaming is inhibited by reducing an alcohol generated by condensation of the alkoxysilane and Si—OH group. However, an adjustment of the content of Si—OH group in a silicone resin is not described at all in Patent Publication 3, and it is not considered that adhesion is improved while inhibiting foaming in curing. In a silicone synthesized by condensation of alkoxysilane, there exists a problem that strictly controlling the content of Si—OH group is difficult.

In a curable composition containing a silicone, it is preferable that the molecular weight of the used silicone can be easily adjusted. Furthermore, if the obtained cured product has an excellent heat resisting property without foaming in curing, it can be regarded as a useful sealing agent for semiconductors. For example, in a sealing material of high-brightness light emitting elements such as LED and semiconductor laser, further high heat resisting property has been required.

Furthermore, in a sealing material for semiconductors, maintaining transparency without deterioration such as degeneration and coloring under high temperatures and low moisture permeability to protect a semiconductor chip are required. However, in a sealing material for semiconductors using a conventional epoxy resin or silicone resin, a sealing material satisfying both maintaining sufficient transparency and low moisture permeability even exposed to high temperatures of 150° C. or higher for a long time has not ever been known.

A silicone obtained by condensation of Si—OH group (hereinafter it may be just referred to as silicone) maintains transparency and has low moisture permeability even exposed to high temperatures for a long time, and besides its adhesion to substrate is high. However, this silicone has a problem that molding of a bulk body is difficult as foaming is generated in heating. In carrying out a condensation of Si—OH groups, it is possible to obtain a bulk body with no air bubbles by conducting a molding by gradually raising the temperature and selecting a condition to avoid the generation of air bubbles in the bulk body after water as a by-product forms bubbles as water vapor. However, to obtain a bulk body having no bubble, in forming the bulk body, it is necessary to very slowly raise the temperature from a low temperature and to finally heat at a high temperature for a long time, so the productivity is low. Therefore, there has been a problem that the use for a sealing material for semiconductors such as LED and semiconductor laser is difficult.

PRIOR ART PUBLICATIONS

Patent Publications

Patent Publication 1: Japanese Patent Application Publication 2005-325174
Patent Publication 2: Japanese Patent Application Publication 2009-215345
Patent Publication 3: Japanese Patent Application Publication 2012-129316

SUMMARY OF THE INVENTION

It is an object of the present invention to provide a curable composition that suppresses foaming in the cured product after water as a by-product turns into water vapor in dehydration condensation of a silicone when making the cured product by curing under heating condition, that gives an excellent adhesion to base body, such as semiconductor substrate, when a cured film has been made, and that gives heat resisting property with no coloring by heating.

In the present invention, a curable composition which gives a cured product which has an excellent adhesion to base body without foaming in curing and an excellent heat resisting property without coloring by heating (continuous heating for 200 hours at 200° C.) can be obtained by mixing at a specific composition ratio with combinations of two hydrosilyl group-containing silicones (A-1) and (A-2), which are made by different production methods, and two vinylsilyl group-containing silicones (B-1) and (B-2), which are made likewise by different production methods, excepting a combination of only silicones (A-1) and (B-1), and a combination of only silicones (A-2) and (B-2).

The curable composition of the present invention comprises two types of silicones having different structures, which are silicone (A) having Si—OH group and Si—H group, and silicone (B) having Si—OH group and Si—CH=CH$_2$ group, and a hydrosilylation catalyst containing at least one metal compound selected from the group consisting of platinum compounds, palladium compounds, and rhodium compounds.

In the curable composition of the present invention, by using a silicone (A) containing Si—H group and a silicone (B) containing Si—CH=CH$_2$ group at the same time, both a dehydration condensation reaction in which Si—OH groups are reacted with each other and a hydrosilylation reaction in which Si—H group and Si—CH=CH$_2$ group are reacted are allowed to proceed in parallel in curing. Then, by restricting the content of Si—OH group in the curable composition to the extent that adhesion to base body is not spoiled when a cured product has been made, the condensation reaction of Si—OH group, which is involved in foaming by water as a by-product, is suppressed. Furthermore, by raising the proportion of addition polymerization reaction by silylation reaction of Si—H group and Si—CH=CH$_2$ group by adjusting the contents of Si—H group and Si—CH=CH$_2$ group, the bubble formation in the cured body is inhibited.

That is, the present invention comprises the following Inventions 1-6.

[Invention 1]

A curable composition, comprising:
(1) a silicone (A) containing Si—OH group and Si—H group,
(2) a silicone (B) containing Si—OH group and Si—CH=CH$_2$ group, and
(3) a hydrosilylation catalyst of a catalytic amount containing at least one metal compound selected from the group consisting of platinum compounds, palladium compounds, and rhodium compounds,
wherein (a): the silicone (A) is the following silicone (A-1) and/or silicone (A-2), the silicone (B) is the following silicone (B-1) and/or silicone (B-2), in case that the silicone (A) comprises at least the silicone (A-1), the silicone (B) comprises at least the silicone (B-2), and in case that the silicone (A) comprises at least the silicone (A-2), the silicone (B) comprises at least the silicone (B-1),
wherein (b): a molar ratio of the Si—H group to the Si—CH=CH$_2$ group in the silicone (A) and the silicone (B) which are contained in the curable composition is in a range of 4:1 to 1:1,
and wherein (c): in the curable composition, a content of the Si—OH groups relative to the total amount of the curable composition is 3.4 mass % or greater and 9.8 mass % or less, a content of the Si—H group is 0.1 mmol/g or greater and 5.0 mmol/g or less in molar content relative to the curable composition, and a content of the Si—CH=CH$_2$ group is 0.1 mmol/g or greater and 5.0 mmol/g or less.

(i) Silicone (A-1):

A silicone containing 10 mass % or greater of Si—OH group relative to the total amount of the silicone (A-1), which is obtained by hydrolysis and polycondensation of at least one alkoxysilane selected from the group consisting of: an alkoxysilane represented by the general formula (1)

(in the formula, each of $R^1$ and $R^2$ is a hydrogen atom, a fluorine atom, a hydroxyl group, an alkyl group which is $C_{1-6}$ straight-chain, $C_{3-6}$ branched-chain, or $C_{3-6}$ cyclic, or an aryl group which is $C_{6-15}$, in the alkyl group or aryl group, a part of or all of hydrogen atom(s) may be replaced with fluorine atom(s), a part of carbon atom(s) may be replaced with oxygen atom(s) or nitrogen atom(s), and $R^3$ is a methyl group, an ethyl group, or an isopropyl group.),
an alkoxysilane represented by the general formula (2)

(in the formula, $R^4$ is a hydrogen atom, a fluorine atom, a hydroxyl group, an alkyl group which is $C_{1-6}$ straight-chain, $C_{3-6}$ branched-chain, or $C_{3-6}$ cyclic, or an aryl group which is $C_{6-15}$, in the alkyl group or aryl group, a part of or all of hydrogen atom(s) may be replaced with fluorine atom(s), a part of carbon atom(s) may be replaced with oxygen atom(s) or nitrogen atom(s), and $R^5$ is a methyl group, an ethyl group, or an isopropyl group.), and an alkoxysilane represented by the general formula (3)

$$Si(OR^6)_4 \quad (3)$$

(in the formula, $R^6$ is a methyl group, an ethyl group, or an isopropyl group.)
with
an alkoxysilane represented by the general formula (4)

$$H-Si(OR^7)_3 \quad (4)$$

(in the formula, $R^7$ is a methyl group, an ethyl group, or an isopropyl group.) under an acid condition or a basic condition.

(ii) Silicone (A-2):

A silicone containing 3.3 mass % or less of Si—OH group relative to the total amount of the silicone (A-2), which is obtained by reacting a reaction product containing Si—OH group and obtained by hydrolysis and polycondensation, under an acid condition or a basic condition, of at least one alkoxysilane selected from the group consisting of:
an alkoxysilane represented by the general formula (1)

$$R^1R^2Si(OR^3)_2 \quad (1)$$

(in the formula, $R^1$-$R^3$ are the same as the above.),
an alkoxysilane represented by the general formula (2)

$$R^4Si(OR^5)_3 \quad (2)$$

(in the formula, $R^4$ and $R^5$ are the same as the above.), and an alkoxysilane represented by the general formula (3)

$$Si(OR^6)_4 \quad (3)$$

(in the formula, $R^6$ is the same as the above.)
with
at least one silane compound containing Si—H group selected from the group consisting of a silane compound containing Si—H group represented by the general formula (5-1), the general formula (5-2), the general formula (5-3), or the general formula (5-4)

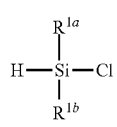
(5-1)

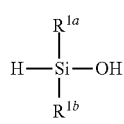
(5-2)

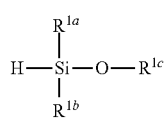
(5-3)

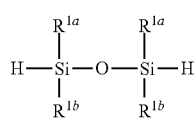
(5-4)

(in the formulas, each of $R^{1a}$ and $R^{1b}$ is independently a fluorine atom, an alkyl group which is $C_{1-6}$ straight-chain, $C_{3-6}$ branched-chain, or $C_{3-6}$ cyclic, or an aryl group which is $C_{6-15}$, in the alkyl group or aryl group, a part of or all of hydrogen atom(s) may be replaced with fluorine atom(s), a part of carbon atom(s) may be replaced with oxygen atom(s) or nitrogen atom(s), and $R^{1c}$ is a methyl group, an ethyl group, or an isopropyl group.).

(iii) Silicone (B-1):

A silicone containing 10 mass % or greater of Si—OH group relative to the total amount of the silicone (B-1), which is obtained by hydrolysis and polycondensation of at least one alkoxysilane selected from the group consisting of:
an alkoxysilane represented by the general formula (1)

$$R^1R^2Si(OR^3)_2 \quad (1)$$

(in the formula, $R^1$-$R^3$ are the same as the above.),
an alkoxysilane represented by the general formula (2)

$$R^4Si(OR^5)_3 \quad (2)$$

(in the formula, $R^4$ and $R^5$ are the same as the above.), and an alkoxysilane represented by the general formula (3)

$$Si(OR^6)_4 \quad (3)$$

(in the formula, $R^6$ is the same as the above.)
with
an alkoxysilane represented by the general formula (6)

$$CH_2=CH-Si(OR^8)_3 \quad (6)$$

(in the formula, $R^8$ is a methyl group, an ethyl group, or an isopropyl group.) under an acid condition or a basic condition.

(iv) Silicone (B-2):

A silicone containing 3.3 mass % or less of Si—OH group relative to the total amount of the silicone (B-2), which is obtained by reacting a reaction product containing Si—OH group and obtained by hydrolysis and polycondensation, under an acid condition or a basic condition, of at least one alkoxysilane selected from the group consisting of:
an alkoxysilane represented by the general formula (1)

$$R^1R^2Si(OR^3)_2 \quad (1)$$

(in the formula, $R^1$-$R^3$ are the same as the above.),
an alkoxysilane represented by the general formula (2)

$$R^4Si(OR^5)_3 \quad (2)$$

(in the formula, $R^4$ and $R^5$ are the same as the above.), and an alkoxysilane represented by the general formula (3)

$$Si(OR^6)_4 \quad (3)$$

(in the formula, $R^6$ is the same as the above.)
with
at least one compound selected from the group consisting of a silane compound containing Si—CH=CH$_2$ group represented by the general formula (7-1), the general formula (7-2), the general formula (7-3), or the general formula (7-4)

(7-1)

-continued

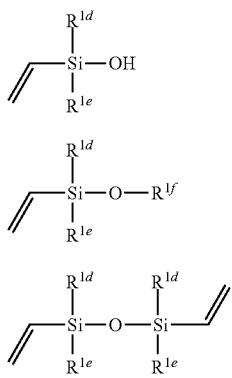

(7-2)

(7-3)

(7-4)

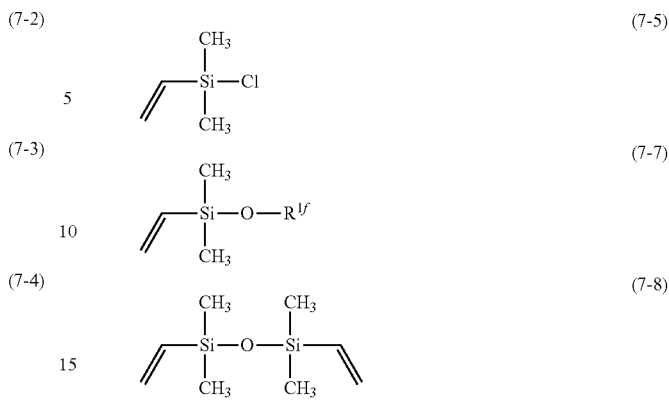

(7-5)

(7-7)

(7-8)

(in the formulas, each of $R^{1d}$ and $R^{1e}$ is independently a fluorine atom, an alkyl group which is $C_{1-6}$ straight-chain, $C_{3-6}$ branched-chain, or $C_{3-6}$ cyclic, or an aryl group which is $C_{6-15}$, in the alkyl group or aryl group, a part of or all of hydrogen atom(s) may be replaced with fluorine atom(s), a part of carbon atom(s) may be replaced with oxygen atom(s) or nitrogen atom(s), and $R^{1f}$ is a methyl group, an ethyl group, or an isopropyl group.).

The mention "(a): the silicone (A) is the above silicone (A-1) and/or silicone (A-2), the silicone (B) is the following silicone (B-1) and/or silicone (B-2), in case that the silicone (A) comprises at least the silicone (A-1), the silicone (B) comprises at least the silicone (B-2), and in case that the silicone (A) comprises at least the silicone (A-2), the silicone (B) comprises at least the silicone (B-1)" means, in other words, "a combination of only silicones (A-1) and (B-1), and a combination of only silicones (A-2) and (B-2) are excepted".

Compositions formed by a combination of only silicones (A-1) and (B-1) and a combination of only silicones (A-2) and (B-2) may foam in curing and may not get adhesion to a base body.

[Invention 2]
The curable composition as described in the Invention 1, wherein the silane compound containing Si—H group is a silane compound represented by the formula (5-5), (5-8), or (5-9).

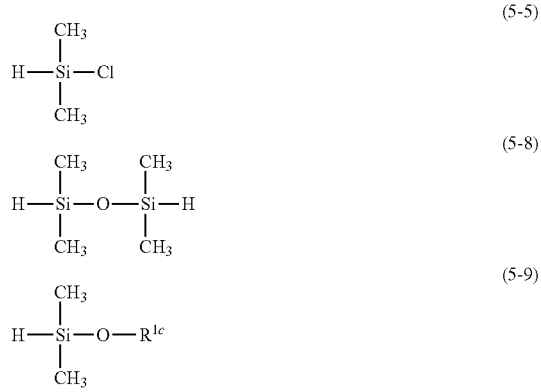

(5-5)

(5-8)

(5-9)

[Invention 3]
The curable composition as described in Invention 1, wherein the silane compound containing Si—CH=CH$_2$ group is a silane compound represented by the formula (7-5), (7-7), or (7-8).

[Invention 4]
A cured product made by curing the curable composition of Inventions 1-3.

[Invention 5]
A sealing material made by using the cured product of Invention 4.

[Invention 6]
A method for producing a cured product, wherein the curable composition of Inventions 1-3 is cured by heating to 70° C. or higher and 300° C. or lower.

Effect of the Invention

In a curable composition of the present invention, there are used two specific types of silicones having different structures, which are a silicone (A) having Si—OH group and Si—H group and a silicone (B) having Si—OH group and Si—CH=CH$_2$ group, and the content of Si—OH group in each silicone can be adjusted. With this, it is possible to obtain a desired adhesion between a cured product and a base body to be sealed with the cured product, while suppressing foaming in the cured body by suppressing a dehydration condensation reaction of Si—OH groups, relative to a hydrosilylation reaction in which the Si—CH=CH$_2$ group and the Si—H group react together, when curing the silicones.

Specifically, in the curable composition of the present invention, by adjusting the content of Si—OH group in the range of 3.4 mass % or greater and 9.8 mass % or less while combing the four types of silicones having different structures which are a silicone (A-1) containing 10 mass % or greater of Si—OH group while containing Si—H group, a silicone (B-1) containing 10 mass % or greater of Si—OH group while containing Si—CH=CH$_2$ group, a silicone (A-2) containing 3.3 mass % or less of Si—OH group while containing Si—H group, and a silicone (B-2) containing 3.3 mass % or less of Si—OH group while containing Si—CH=CH$_2$ group, a hydrosilylation reaction which is a reaction of Si—CH=CH$_2$ group and Si—H group is preferentially reacted relative to a dehydration condensation reaction between Si—OH groups, and thereby foaming in the cured body is inhibited. Therefore, the desired adhesion between a cured product and a base body sealed with the cured product can be obtained with formability being secured. (however, a combination of only silicones (A-1) and (B-1), and a combination of only silicones (A-2) and (B-2) are excepted)

Furthermore, the curable composition of the present invention provides a cured product having an excellent heat resisting property without coloring by heating (continuous heating for 200 hours at 200° C.).

DETAILED DESCRIPTION

The curable composition of the present invention comprises the selection of four types of silicones having different structures which are a silicone (A-1) containing 10 mass % or greater of Si—OH group while containing Si—H group, a silicone (B-1) containing 10 mass % or greater of Si—OH group while containing Si—CH=CH$_2$ group, a silicone (A-2) containing 3.3 mass % or less of Si—OH group while containing Si—H group, and a silicone (B-2) containing 3.3 mass % or less of Si—OH group while containing Si—CH=CH$_2$ group, and a hydrosilylation catalyst containing at least one metal compound selected from the group consisting of platinum compounds, palladium compounds, and rhodium compounds.

In the curable composition of the present invention, the Si—OH content in the curable composition is adjusted to the range of 3.4 mass % or greater and 9.8 mass % or less by selecting and combining the above silicones (A-1), (A-2), (B-1), and (B-2), and a hydrosilyl catalyst is added to the composition, thereby having both formability and adhesion. In case that Si—H group, Si—CH=CH$_2$ group, and Si—OH group exist in the curable composition, in curing, both the dehydration condensation reaction between Si—OH groups and the hydrosilylation reaction which is a reaction of Si—CH=CH$_2$ group and Si—H group proceed in parallel. Then, foaming in a cured product due to generation of water as a by-product by the condensation reaction of Si—OH groups can be inhibited by restricting the content of Si—OH group in the curable composition to the extent that adhesion to base body is not spoiled by adjusting the Si—OH content when making a cured product. Furthermore, by adjusting the molar ratio of Si—H group to Si—CH=CH$_2$ group to 4:1 to 1:1, the proportion of the addition polymerization reaction by the silylation reaction of Si—H group and Si—CH=CH$_2$ group is raised, and formation of bubbles in a cured body is inhibited.

Of the above combination, a curable composition formed of a combination of only the above silicones (A-1) and (B-1) is not preferable, because it is not possible to inhibit foaming when making a cured product due to the Si—OH content in the curable composition getting more than 9.8 mass %. Furthermore, a curable composition formed of a combination of only the above silicones (A-2) and (B-2) is not preferable, because adhesion to base body when making a cured product becomes inferior due to the Si—OH content in the curable composition getting less than 3.4 mass %.

By heating the curable composition of the present invention, both the hydrosilylation reaction by Si—H group and Si—CH=CH$_2$ group and the dehydration condensation reaction between Si—OH groups proceed in parallel. By adjusting the content of Si—OH group in the curable composition to 3.4 mass % or greater and 9.8 mass % or less and by adjusting the contents of Si—H group and Si—CH=CH$_2$ group involved in the hydrosilylation reaction, the content of Si—OH group is reduced as compared with the contents of Si—H group and Si—CH=CH$_2$ group. When making a curing by selecting and combining the silicones (A-1), (A-2), (B-1), and (B-2), in a reaction system in which the hydrosilylation reaction and the dehydration condensation reaction coexist, by reducing generation of water vapor by water as a by-product by the dehydration condensation reaction, it becomes possible to inhibit foaming in a bulk which is a cured product.

The adjustment of the contents of Si—OH group, Si—H group, Si—OH group, and Si—CH=CH$_2$ group of the curable composition, and the viscosity adjustment of the curable composition can be conducted by specifying kinds of silicone (A-1), (A-2) and silicone (B-1), (B-2), composition ratios of them, molecular weights of them, and a method for producing them.

1. Curable Composition

The curable composition of the present invention is a combination by selecting from a silicone (A-1) containing 10 mass % or greater of Si—OH group while containing Si—H group, a silicone (A-2) containing 3.3 mass % or less of Si—OH group while containing Si—H group, a silicone (B-1) containing 10 mass % or greater of Si—OH group while containing Si—CH=CH$_2$ group, and a silicone (B-2) containing 3.3 mass % or less of Si—OH group while containing Si—CH=CH$_2$ group, and contains at least one hydrosilylation catalyst (C) selected from the group consisting of platinum compounds, palladium compounds, and rhodium compounds.

In the curable composition prepared by selecting from the above four types of silicones and adjusting Si—OH group to 3.4 mass % or greater and 9.8 mass % or less, the ratio of Si—H group to Si—CH=CH$_2$ group is in a range of 4:1 to 1:1 by molar ratio, the content of a hydrosilylation catalyst to the total amount of the curable composition is 0.1 mass ppm or greater and 200 mass ppm or less, and Si—OH group to the total mass of the curable composition is 3.4 mass % or greater and 9.8 mass % or less. In molar content to the curable composition, the content of Si—H group is 0.1 mmol/g or greater and 5.0 mmol/g or less, and the content of Si—CH=CH$_2$ group is 0.1 mmol/g or greater and 5.0 mmol/g or less.

In case that Si—H group is more than 4 mol to 1 mol of Si—CH=CH$_2$ group, curing don't progress well. In case that Si—H group is less than 1 mol, as heat resisting property of the obtained cured product gets poor, a cured product easily turn yellow under high temperatures.

In case that Si—OH group is less than 3.4 mass %, adhesion to base body decreases. In case that Si—OH group is more than 9.8 mass %, it easily foams in curing. In case that Si—H group is less than 0.1 mmol/g, curing becomes hard and tackiness easily arises. In case that Si—CH=CH$_2$ group is less than 0.1 mmol/g, curing becomes hard and tackiness easily arises. In case that Si—CH=CH$_2$ group is more than 5.0 mmol/g, as heat resisting property is deteriorated, a cured product easily turn yellow.

2. Kinds of Silicone (A-1), (A-2) and Silicone (B-1), (B-2)

In the curable composition of the present invention, at least one kind selected from silicone (A-1) and silicone (A-2) is selected, at least one kind selected from silicone (B-1) and silicone (B-2) is selected, and the content of Si—OH group and the molar ratio of Si—H group to Si—CH=CH$_2$ group in the curable composition are adjusted. In the curable composition of the present invention, it becomes possible to obtain a cured product having no foaming and to obtain the desired adhesion between the cured product and a base body by using two kinds or greater of silicones selected from silicone (A-1) or silicone (A-2) and silicone (B-1) or silicone (B-2) except for the combinations of only silicone (A-1) and silicone (B-1) and of only silicone (A-2) and silicone (B-2), adjusting Si—OH group to 3.4 mass % or greater and 9.8 mass % or less and, and adjusting the ratio of Si—H group to Si—CH=CH$_2$ group to 4:1 to 1:1 in molar ratio.

In the curable composition of the present invention, by conducting a condensation reaction by using the above at least one alkoxysilane selected from an alkoxysilane represented by the general formula (1), an alkoxysilane represented by the general formula (2), and an alkoxysilane represented by the general formula (3), and the above alkoxysilane (4) containing Si—H group, the silicone (A-1) containing Si—H group is synthesized. Furthermore, by conducting a condensation reaction by using the above at least one alkoxysilane selected from an alkoxysilane represented by the general formula (1), an alkoxysilane represented by the general formula (2), and an alkoxysilane represented by the general formula (3), and the above alkoxysilane (6) containing Si—CH=CH$_2$ group, the silicone (B-1) containing Si—CH=CH$_2$ group is synthesized.

It is preferable that the silicone (A-1) and the silicone (B-1) contain 10 mass % or greater of Si—OH group to the total amount of these silicones. In case of exceeding this range, it gets hard to adjust the molar ratio of Si—OH group, Si—H group, and Si—CH=CH$_2$ group in mixing the four types of silicones.

Furthermore, by reacting the above at least one alkoxysilane selected from an alkoxysilane (1) represented by the general formula (1), an alkoxysilane (2) represented by the general formula (2), and an alkoxysilane (3) represented by the general formula (3), with the above monochlorosilane compound (5-1), monoalkoxysilane compound (5-2), monosilanol compound (5-3), or disiloxane compound (5-4) which contain Si—H group, the silicone (A-2) containing Si—H group is synthesized. Furthermore, by reacting it with the above monochlorosilane compound (7-1), monoalkoxysilane compound (7-2), monosilanol compound (7-3), or disiloxane compound (7-4) which contain Si—CH=CH$_2$ group, the silicone (B-2) containing Si—CH=CH$_2$ group is synthesized. It is preferable that the silicone (A-2) and the silicone (B-2) contain 3.3 mass % or less of Si—OH group to the total amount of these silicones. In case of exceeding this range, it is hard to adjust the molar ratio of Si—OH group, Si—H group, and Si—CH=CH$_2$ group in mixing the four types of silicones.

[Silicone (A-1)]

Silicone (A-1) is a silicone containing 10 mass % or greater of Si—OH group to the total amount, which is obtained by hydrolysis and polycondensation of at least one alkoxysilane selected from the group consisting of:

an alkoxysilane represented by the general formula (1)

(in the formula, each of $R^1$ and $R^2$ is a hydrogen atom, a fluorine atom, a hydroxyl group, an alkyl group which is $C_{1-6}$ straight-chain, $C_{3-6}$ branched-chain, or $C_{3-6}$ cyclic, or an aryl group which is $C_{6-15}$, furthermore in the alkyl group or aryl group, a part of or all of hydrogen atom(s) may be replaced with fluorine atom(s), a part of carbon atom(s) may be replaced with oxygen atom(s) or nitrogen atom(s), and $R^3$ is a methyl group, an ethyl group, or an isopropyl group.), an alkoxysilane represented by the general formula (2)

(in the formula, $R^4$ is a hydrogen atom, a fluorine atom, a hydroxyl group, an alkyl group which is $C_{1-6}$ straight-chain, $C_{3-6}$ branched-chain, or $C_{3-6}$ cyclic, or an aryl group which is $C_{6-15}$, furthermore in the alkyl group or aryl group, a part of or all of hydrogen atom(s) may be replaced with fluorine atom(s), a part of carbon atom(s) may be replaced with oxygen atom(s) or nitrogen atom(s), and $R^5$ is a methyl group, an ethyl group, or an isopropyl group.), and an alkoxysilane represented by the general formula (3)

(in the formula, $R^6$ is a methyl group, an ethyl group, or an isopropyl group.)

with an alkoxysilane represented by the general formula (4)

(in the formula, $R^7$ is a methyl group, an ethyl group, or an isopropyl group.) under an acid condition or a basic condition.

As the organic groups represented by $R^1$, $R^2$, and $R^4$, specifically, it is possible to cite hydrogen, methyl group, ethyl group, n-propyl group, n-butyl group, n-pentyl group, n-hexyl group, isopropyl group, isobutyl group, t-butyl group, phenyl group, naphthyl group, trifluoromethyl group, pentafluoroethyl group, heptafluoro-n-propyl group, or nonafluoro-n-butyl group.

[Silicone (A-2)]

Silicone (A-2) is a silicone containing 3.3 mass % or less of Si—OH group to the total amount of the silicone (A-2), which is obtained by reacting a reaction product containing Si—OH group and obtained by hydrolysis and polycondensation, under an acid condition or a basic condition, of at least one alkoxysilane selected from the group consisting of:

an alkoxysilane represented by the general formula (1)

(in the formula, $R^1$-$R^3$ are the same as the above.), an alkoxysilane represented by the general formula (2)

(in the formula, $R^4$ and $R^5$ are the same as the above.), and an alkoxysilane represented by the general formula (3)

(in the formula, $R^6$ is the same as the above.)

with at least one silane compound containing Si—H group and selected from the group represented by the general formula (5-1), the general formula (5-2), the general formula (5-3), or the general formula (5-4)

-continued

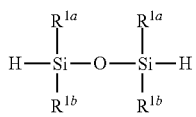
(5-4)

(in the formula, each of $R^{1a}$ and $R^{1b}$ is independently a fluorine atom, an alkyl group which is $C_{1-6}$ straight-chain, $C_{3-6}$ branched-chain, or $C_{3-6}$ cyclic, or an aryl group which is $C_{6-15}$, furthermore in the alkyl group or aryl group, a part of or all of hydrogen atom(s) may be replaced with fluorine atom(s), a part of carbon atom(s) may be replaced with oxygen atom(s) or nitrogen atom(s), and $R^{1c}$ is a methyl group, an ethyl group, or an isopropyl group.).

As the organic groups represented by $R^{1a}$ and $R^{1b}$, specifically, it is possible to cite hydrogen, methyl group, ethyl group, n-propyl group, n-butyl group, n-pentyl group, n-hexyl group, isopropyl group, isobutyl group, t-butyl group, phenyl group, naphthyl group, trifluoromethyl group, pentafluoroethyl group, heptafluoro-n-propyl group, or nonafluoro-n-butyl group.

It is preferable that the organic groups represented by $R^{1a}$ and $R^{1b}$ are methyl groups. Therefore, it is possible to cite the following silane compounds.

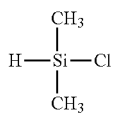
(5-5)

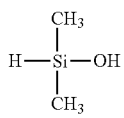
(5-6)

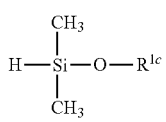
(5-7)

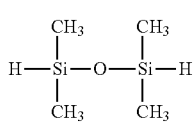
(5-8)

It is preferable that the silane compound containing Si—H group is one represented by the formula (5-5), (5-8), or (5-9) from the viewpoints of easy availability and easy synthesis.

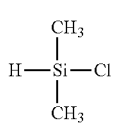
(5-5)

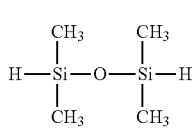
(5-8)

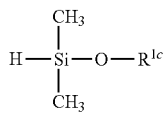
(5-9)

[Silicone (B-1)]

Silicone (B-1) is a silicone containing 10 mass % or greater of Si—OH group to the total amount, which is obtained by hydrolysis and polycondensation of at least one alkoxysilane selected from the group consisting of:

an alkoxysilane represented by the general formula (1)

$$R^1R^2Si(OR^3)_2 \quad (1)$$

(in the formula, $R^1$-$R^3$ are the same as the above.),
an alkoxysilane represented by the general formula (2)

$$R^4Si(OR^5)_3 \quad (2)$$

(in the formula, $R^4$ and $R^5$ are the same as the above.), and
an alkoxysilane represented by the general formula (3)

$$Si(OR^6)_4 \quad (3)$$

(in the formula, $R^6$ is the same as the above.)
with
an alkoxysilane represented by the general formula (6)

$$CH_2=CH-Si(OR^8)_3 \quad (6)$$

(in the formula, $R^8$ is a methyl group, an ethyl group, or an isopropyl group.) under an acid condition or a basic condition.

[Silicone (B-2)]

Silicone (B-2) is a silicone containing 3.3 mass % or less of Si—OH group to the total amount, which is obtained by reacting a reaction product containing Si—OH group and obtained by hydrolysis and polycondensation, under an acid condition or a basic condition, of at least one alkoxysilane selected from the group consisting of:

an alkoxysilane represented by the general formula (1)

$$R^1R^2Si(OR^3)_2 \quad (1)$$

(in the formula, $R^1$-$R^3$ are the same as the above.),
an alkoxysilane represented by the general formula (2)

$$R^4Si(OR^5)_3 \quad (2)$$

(in the formula, $R^4$ and $R^5$ are the same as the above.), and
an alkoxysilane represented by the general formula (3)

$$Si(OR^6)_4 \quad (3)$$

(in the formula, $R^6$ is the same as the above.)
with
at least one compound selected from the group consisting of a silane compound containing Si—CH=CH$_2$ group and represented by the general formula (7-1), the general formula (7-2), the general formula (7-3), or the general formula (7-4)

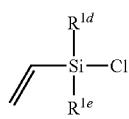
(7-1)

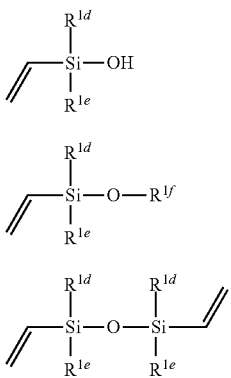

(7-2)

(7-3)

(7-4)

(in the formula, each of $R^{1d}$ and $R^{1e}$ is independently a fluorine atom, an alkyl group which is $C_{1-6}$ straight-chain, $C_{3-6}$ branched-chain, or $C_{3-6}$ cyclic, or an aryl group which is $C_{6-15}$, furthermore in the alkyl group or aryl group, a part of or all of hydrogen atom(s) may be replaced with fluorine atom(s), a part of carbon atom(s) may be replaced with oxygen atom(s) or nitrogen atom(s), and $R^{1f}$ is a methyl group, an ethyl group, or an isopropyl group.).

As the organic groups represented by $R^{1d}$ and $R^{1e}$, specifically, it is possible to cite hydrogen, methyl group, ethyl group, n-propyl group, n-butyl group, n-pentyl group, n-hexyl group, isopropyl group, isobutyl group, t-butyl group, phenyl group, naphthyl group, trifluoromethyl group, pentafluoroethyl group, heptafluoro-n-propyl group, or nonafluoro-n-butyl group.

It is preferable that the organic groups represented by $R^{1d}$ and $R^{1e}$ are methyl groups. Therefore, it is possible to cite the following silane compounds.

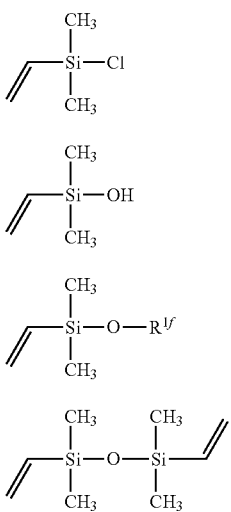

(7-5)

(7-6)

(7-7)

(7-8)

At this moment, from the viewpoints of easy availability and easy synthesis, it is preferable that the silane compound containing Si—CH=CH$_2$ group is one represented by the formula (7-5), the formula (7-7), or the formula (7-8) (in the formula, $R^{1f}$ is a methyl group, an ethyl group, or an isopropyl group).

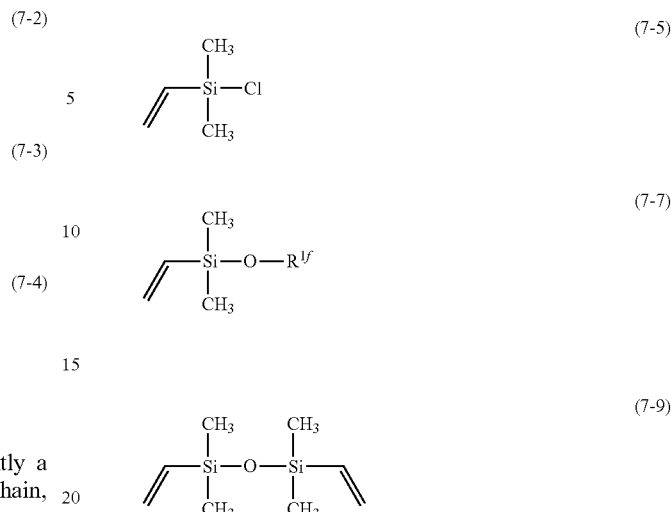

(7-5)

(7-7)

(7-9)

3. Method for Preparing Silicone (A-1), Silicone (A-2), Silicone (B-1), and Silicone (B-2)

Concrete examples of a method for preparing silicone (A-1), silicone (A-2), silicone (B-1), and silicone (B-2), which are used in a curable composition of the present invention, are explained. However, these methods are not limited to the following methods.

[Method for Preparing Silicone (A-1) and Silicone (B-1)]

In synthesizing a silicone, the alkoxysilane containing Si—H group, represented by the above general formula (4), is added to at least one alkoxysilane selected from the alkoxysilanes represented by the above general formulas (1)-(3), followed by conducting a condensation, thereby obtaining the silicone (A-1).

In synthesizing a silicone, the alkoxysilane containing Si—CH=CH$_2$ group, represented by the above general formula (6), is added to at least one alkoxysilane selected from the alkoxysilanes represented by the above general formulas (1)-(3), followed by conducting a condensation, thereby obtaining the silicone (B-1).

<Silicone (A-1)>

The silicone (A-1) is prepared by the reaction shown in the following reaction scheme. At least one alkoxysilane is selected from the alkoxysilanes represented by the above general formulas (1)-(3). Furthermore, it is hydrolyzed and polycondensed together with the alkoxysilane represented by the above general formula (4) under an acid condition or a basic condition, thereby the silicone (A-1) can be obtained.

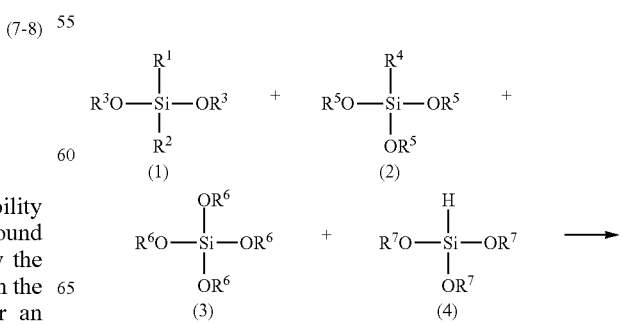

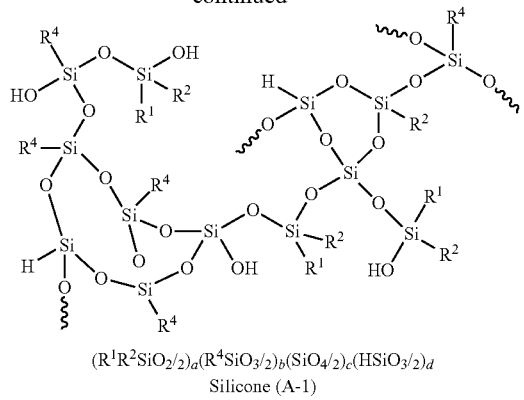

$(R^1R^2SiO_{2/2})_a(R^4SiO_{3/2})_b(SiO_{4/2})_c(HSiO_{3/2})_d$

Silicone (A-1)

<Silicone (B-1)>

The silicone (B-1) is prepared by the reaction shown in the following reaction scheme. At least one alkoxysilane is selected from the alkoxysilanes represented by the above general formulas (1)-(3). Furthermore, it is hydrolyzed and polycondensed together with the alkoxysilane represented by the above general formula (6) under an acid condition or a basic condition, thereby the silicone (B-1) can be obtained.

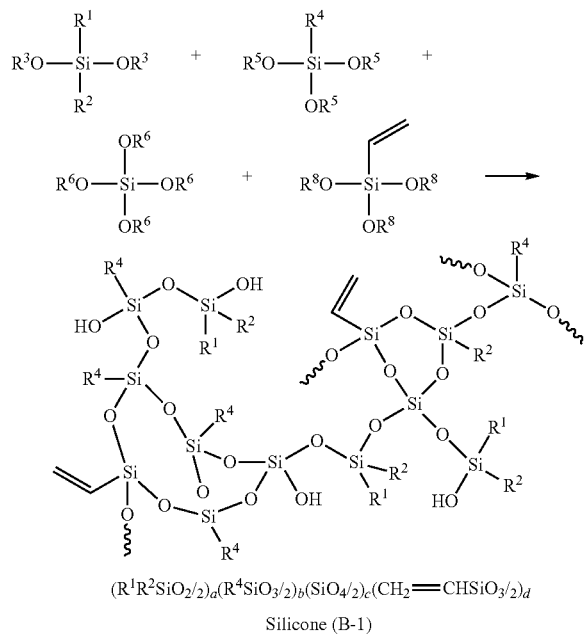

$(R^1R^2SiO_{2/2})_a(R^4SiO_{3/2})_b(SiO_{4/2})_c(CH_2\!=\!CHSiO_{3/2})_d$

Silicone (B-1)

<Preparation>

Specifically, at least one alkoxysilane is selected from the alkoxysilanes represented by the above general formulas (1)-(3). A specified quantity of an alkoxysilane represented by the general formula (6) or (7) is put into a reaction vessel at room temperature. After that, water to hydrolyze each alkoxysilane, a hydrophilic organic solvent as the reaction solvent, preferably alcohol, an acid catalyst to progress the condensation reaction, preferably acetic acid, are added. Next, by progressing the hydrolysis and the condensation reaction by heating the reaction solution to 90° C. or higher and 100° C. or lower and stirring the contents, a silicone (A-1) or a silicone (B-1) is obtained. At that time, to prevent the unreacted alkoxysilanes, water, alcohol, or acetic acid in the reaction system from being distilled off out of the reaction system, it is preferable that the reaction vessel is equipped with a condenser which is a reflux device.

As a hydrolysis polycondensation catalyst of this reaction, an acid catalyst or a basic catalyst can be used. From the viewpoint of easiness of molecular weight control of the hydrolysis condensation product, acid catalyst is preferable out of the two catalysts.

As an acid catalyst used in this reaction, it is possible to cite acetic acid, hydrochloric acid, nitric acid, sulfuric acid, hydrofluoric acid, trifluoromethanesulfonic acid, tosic acid, or trifluoroacetic acid. Acetic acid, hydrochloric acid, nitric acid, sulfuric acid, or hydrofluoric acid is preferable because of easiness of removal. Furthermore, acetic acid is more preferable.

As a basic catalyst used in this reaction, it is possible to cite sodium hydroxide, potassium hydroxide, lithium hydroxide, magnesium hydroxide, sodium carbonate, potassium carbonate, or cesium carbonate, etc., which are inorganic bases.

A necessary time for the condensation reaction is normally 3 hours or longer and 15 hours or shorter. After lowering the temperature of the reaction solution to room temperature after the condensation reaction, extraction is conducted by contacting a non-aqueous organic solvent to take out a silicone (A-1) or a silicone (B-1) existing in the reaction system. Next, the acetic acid contained in the reaction system is removed by washing with water. After that, after a very small quantity of water dissolved in the reaction system is removed by adding a solid desiccant, the moisture is absolutely removed by adding a solid desiccant and then conducting filtration. Finally, by removing the non-aqueous organic solvent under reduced pressure, a silicone (A-1) or a silicone (B-1) can be obtained. Furthermore, without using a solid desiccant, water may be simultaneously removed under reduced pressure in the process of removing the non-aqueous organic solvent under reduced pressure.

Furthermore, it is preferable that molar equivalent of water used in the hydrolysis and the condensation reaction to obtain a silicone (A-1) or a silicone (B-1) is 1.5 or greater and 5 or less times the total molar equivalent of the alkoxy groups contained in the alkoxysilanes which are the raw material compounds. In case that its equivalent is less than 1.5 times that, as hydrolysis of the alkoxysilanes doesn't proceed efficiently, deterioration by time course arises easily in storage. Its addition by an amount more than 5 times that is not necessary.

As the above hydrophilic solvent, alcohols are suitable. Therefore, it is possible to cite ethanol, n-propanol, isopropanol, or butanol. As the above non-aqueous organic solvent, it is possible to cite diethyl ether, isopropyl ether, or dibutyl ether. As a solid desiccant used to remove water from the above non-aqueous organic solvent after the condensation to obtain a silicone (A-1) or a silicone (B-1), it is possible to cite magnesium sulfate.

By heating and stirring the obtained silicone (A-1) or silicone (B-1), its molecular weight can be also increased (hereinafter it may be referred to as molecular weight-increase treatment). One on which the molecular weight-increase treatment has not been conducted is referred to as silicone (A-1-1) or silicone (B-1-1), and One on which the molecular weight-increase treatment has been conducted is referred to as silicone (A-1-2) or silicone (B-1-2).

In methods for obtaining silicone (A-1-2) or silicone (B-1-2), there are a method that the condensation product is heated with no solvent and a method that the condensation product is heated in toluene with reflux. In the former method, first of all, the condensation product is put into a reaction vessel. In heating, it is preferable to equip the reaction vessel with a condenser to prevent the composition ratio of the silicone from changing. The condensation product is stirred for 6-18 hours with heating to 100° C. or higher and 150° C. or lower. The temperature of the reaction solution is lowered to room temperature after the reaction. It is a method that viscosity and the content of Si—OH are adjusted by conducting this operation 1-4 times. In the latter method, the condensation product is put into a reaction vessel and dissolved into toluene solvent. It is a method that an azeotropic mixture with water in the solution is formed by equipping the reaction vessel with a Dean-Stark trap and heating the toluene solution with reflux. At that time, tosic acid, etc. may be added into the solution. As a preferable viscosity in the curable composition is 50 cP or greater and 1,000,000 cP or less, it is preferable to adjust the viscosity of silicone (A-1-2) or silicone (B-1-2) to 50 cP or greater and 1,000,000 cP or less. A curable composition whose viscosity is out of this range is difficult to conduct mold potting. Viscosity means one of a curable composition at 25° C. measured by using a rotating viscometer (made by Brookfield Engineering Laboratories, Inc., Product Name: DV-II+ PRO) and a temperature control unit (made by Brookfield Engineering Laboratories, Inc., Product Name: THERMO-SEL).

[Methods for Preparing Silicone (A-2) and Silicone (B-2)]

Similar to the preparation of silicone (A-1) and silicone (B-1) except for not using alkoxysilanes represented by the general formula (4) and the general formula (6), a precursor silicone, which is a precursor of silicone (A-2) or silicone (B-2), is synthesized from at least two alkoxysilanes selected from alkoxysilanes represented by the above general formulas (1)-(3). Next, by reacting the precursor silicone and the general formula (5-1), the general formula (5-2), the general formula (5-3), or the general formula (5-4) which contain Si—H group, silicone (A-2) can be obtained. By reacting the precursor silicone and a silane compound represented by the general formula (7-1), the general formula (7-2), the general formula (7-3), or the general formula (7-4), containing Si—CH=CH$_2$ group, silicone (B-2) can be obtained.

[Methods for Preparing Silicone (A-2) and Silicone (B-2)]

Methods for preparing silicone (A-2) and silicone (B-2) are concretely illustrated. There are two types of synthesis method which are a method that a chlorosilane containing Si—H group or Si—CH=CH$_2$ group and Si—H group of the condensation product are reacted and a method that a chlorosilane containing Si—OH group and a disiloxane or alkoxysilane containing Si—H group or Si—CH=CH$_2$ group are subjected to hydrolysis and dehydration condensation under an acid condition. Hereinafter, a silicone synthesized by the former method is described as (A-2-1) or (B-2-1), and a silicone synthesized by the latter method is described as (A-2-2) or (B-2-2).

[Method for Synthesizing Silicone (A-2-1) or Silicone (B-2-1)]

The condensation product is put into a reaction vessel, and a specified quantity of a non-aqueous organic solvent as the reaction solvent used in the reaction, preferably, diethyl ether, tetrahydrofuran, or diisopropyl ether, is put into the reaction vessel, thereby dissolving the condensation product. Next, the contents are stirred while cooling the reaction system in an iced bath, and a silane compound containing Si—H group or Si—CH=CH$_2$ group, specifically, a chlorosilane containing Si—H group represented by the general formula (5-1) or a chlorosilane containing Si—CH=CH$_2$ group represented by the general formula (7-1) is added dropwise to the contents. After the dropping, the contents are reacted while stirring for a few hours under room temperature. The reactant non-aqueous organic solvent layer is separated. Next, the non-aqueous organic solvent layer is washed with an acid aqueous solution, preferably hydrochloric acid, and then washed with water. Furthermore, after removing a very small quantity of water dissolving in the non-aqueous organic solvent layer by using a solid desiccant, the solid desiccant is removed by filtration.

Finally, the objective silicone (A-2-1) or silicone (B-2-1) can be obtained by removing the non-aqueous organic solvent with decompression. Alternatively, it is optional to simultaneously remove water under reduced pressure in the process of removing the non-aqueous solvent under reduced pressure, without using a solid desiccant. After that, water in the silicone is removed by heating and stirring the silicone (A-2-1) or (B-2-1) under no solvent condition. As a preferable viscosity in the curable composition is 50 cP or greater and 1,000,000 cP or less, it is preferable to adjust the viscosity of silicone (A-2-1) or silicone (B-2-1) so as to be 50 cP or greater and 1,000,000 cP or less. A curable composition whose viscosity is out of this range is difficult to conduct mold potting.

[Method for Synthesizing Silicone (A-2-2) or Silicone (B-2-2)]

The condensation product is put into a reaction vessel, and specified quantities of a non-aqueous organic solvent as the reaction solvent used in the reaction, preferably toluene or xylene, and an alcohol solvent, preferably methanol, ethanol, or 2-propanol, is put into the reaction vessel, to dissolve the condensation product. Next, disiloxane or alkoxysilane containing Si—H group or Si—CH=CH$_2$ group, concretely silanol represented by the general formula (5-2), alkoxysilane represented by the general formula (5-3), or disiloxane compound represented by the general formula (5-4), which contain Si—H group, or silanol represented by the general formula (7-2), alkoxysilane represented by the general formula (7-3), or disiloxane compound represented by the general formula (7-4), which contain Si—CH=CH$_2$ group, is added. An inorganic acid as the catalyst of hydrolysis and dehydration condensation, preferably nitric acid, hydrochloric acid, or sulfuric acid, is added into the reaction system, and the contents are reacted while stirring under room temperature. After the reaction, water is added, followed by stirring and then separating the non-aqueous organic solvent layer. Next, the non-aqueous organic solvent layer is washed with ion-exchanged water. Furthermore, after removing a very small quantity of water dissolving in the non-aqueous organic solvent layer by using a solid desiccant, the solid desiccant is removed by filtration.

Finally, the objective silicone (A-2-2) or silicone (B-2-2) can be obtained by removing the non-aqueous organic solvent with decompression. Alternatively, it is optional to simultaneously remove water under reduced pressure in the process of removing the non-aqueous solvent under reduced pressure, without using a solid desiccant. After that, water in the silicone is removed by heating and stirring the silicone (A-2-2) or (B-2-2) under no solvent condition. As a preferable viscosity in the curable composition is 50 cP or greater and 1,000,000 cP or less, it is preferable to adjust the viscosity of silicone (A-2-2) or silicone (B-2-2) so as to be 50 cP or greater and 1,000,000 cP or less. A curable composition whose viscosity is out of this range is difficult to conduct mold potting.

<Chlorosilane Containing Si—H Group>

If a chlorosilane containing Si—H group and represented by the general formula (5-1) is concretely shown, it is possible to cite chlorosilane, chloromethylsilane, chlorodimethylsilane, ethylmethylchlorosilane, diethylchlorosilane, diisopropylchlorosilane, chloro(chloromethyl)methylsilane, chlorophenylsilane, phenylmethylchlorosilane, chloro(2-chloroethyl)silane, chloro(3-chloropropyl)silane, or chlorodiethoxysilane. From the viewpoints of reacting easily and obtaining the desired silicone (A-2-1) easily, it is preferable to use chlorodimethylsilane (ClSi(Me)$_2$-H). (Me represents a methyl group.)

<Chlorosilane Containing Si—CH=CH$_2$ Group>

If a chlorosilane containing Si—CH=CH$_2$ group and represented by the general formula (7-1) is concretely shown, it is possible to cite chlorodimethylvinylsilane, trivinylchlorosilane, chlorodiethylvinylsilane, chlorodiisopropylvinylsilane, chloro(chloromethyl)ethenylmethylsilane, chloro(chloromethyl)diethenylsilane, vinylphenylmethylchlorosilane, or vinyldiphenylchlorosilane. From the viewpoints of reacting easily and obtaining the desired silicone (B-2-1) easily, it is preferable to use chlorodimethylvinylsilane (ClSi(Me)$_2$-CH=CH$_2$).

By using silanols represented by the general formulas (5-2) and (7-2), alkoxysilanes represented by the general formulas (5-3) and (7-3), or disiloxanes represented by the general formulas (5-4) and (7-4) in addition to the above chlorosilanes, the target silicone (A-2-2) or silicone (B-2-2) can be obtained. Hereinafter, concrete compounds of the silanols, alkoxysilanes, and disiloxanes are shown.

<Silanol Containing Si—H Group>

If a silanol containing Si—H group and represented by the general formula (5-2) is concretely shown, it is possible to cite hydroxysilane, hydroxymethylsilane, hydroxydimethylsilane, ethylmethylhydroxysilane, diethylhydroxysilane, diisopropylhydroxysilane, hydroxy(chloromethyl)methylsilane, hydroxyphenylsilane, phenylmethylhydroxysilane, hydroxy(2-chloroethyl)silane, hydroxy(3-chloropropyl)silane, or hydroxydiethoxysilane. From the viewpoints of reacting easily and obtaining the desired silicone (A-2-2) easily, it is preferable to use hydroxydimethylsilane (HO—Si(Me)$_2$-H)

<Silanol Containing Si—CH=CH$_2$ Group>

If a silanol containing Si—CH=CH$_2$ group and represented by the general formula (7-2) is concretely shown, it is possible to cite hydroxydimethylvinylsilane, trivinylhydroxysilane, hydroxydiethylvinylsilane, hydroxydiisopropylvinylsilane, hydroxy(chloromethyl)ethenylmethylsilane, hydroxy(chloromethyl)diethenylsilane, vinylphenylmethylhydroxysilane, or vinyldiphenylhydroxysilane. From the viewpoints of reacting easily and obtaining the desired silicone (B-2-2) easily, it is preferable to use hydroxydimethylvinylsilane (HO—Si(Me)$_2$-CH=CH$_2$).

<Alkoxysilane Containing Si—H Group>

If an alkoxysilane containing Si—H group and represented by the general formula (5-3) is concretely shown, it is possible to cite methoxysilane, ethoxysilane, isopropoxysilane, methoxymethylsilane, ethoxymethylsilane, isopropoxymethylsilane, methoxydimethylsilane, ethoxydimethylsilane, isopropoxydimethylsilane, ethylmethylmethoxysilane, ethylmethylethoxysilane, ethylmethylisopropoxysilane, diethylmethoxysilane, diethylethoxysilane, diethylisopropoxysilane, diisopropylmethoxysilane, diisopropylethoxysilane, diisopropylisopropoxysilane, methoxy(chloromethyl)methylsilane, ethoxy(cholormethyl)methylsilane, isopropoxy(chloromethyl)methylsilane, methoxyphenylsilane, ethoxyphenylsilane, isopropoxyphenylsilane, phenylmethoxysilane, phenylethoxysilane, phenylisopropoxysilane, methoxy(2-chloroethyl)silane, or ethoxy(2-chloroethyl)silane. From the viewpoints of reacting easily and obtaining the desired silicone (A-2-2) easily, it is preferable to use methoxydimethylsilane (MeO—Si(Me)$_2$-H) or ethoxydimethylsilane (EtO—Si(Me)$_2$-H).

<Alkoxysilane Containing Si—CH=CH$_2$ Group>

If an alkoxysilane containing Si—CH=CH$_2$ group and represented by the general formula (7-3) is concretely shown, it is possible to cite methoxyvinylsilane, ethoxyvinylsilane, isopropoxyvinylsilane, methoxymethylvinylsilane, ethoxymethylvinylsilane, isopropoxymethylvinylsilane, methoxydimethylvinylsilane, ethoxydimethylvinylsilane, isopropoxydimethylvinylsilane, ethylmethylmethoxyvinylsilane, ethylmethylethoxyvinylsilane, ethylmethylisopropoxyvinylsilane, diethylmethoxyvinylsilane, diethylethoxyvinylsilane, diethylisopropoxyvinylsilane, diisopropylmethoxyvinylsilane, diisopropylethoxyvinylsilane, diisopropylisopropoxyvinylsilane, methoxy(chloromethyl)metylvinylsilane, ethoxy(chloromethyl)methylvinylsilane, isopropoxy(chloromethyl)methylvinylsilane, methoxyphenylvinylsilane, ethoxyphenylvinylsilane, isopropoxyphenylvinylsilane, phenylmethoxyvinylsilane, phenylethoxyvinylsilane, phenylisopropoxyvinylsilane, methoxy(2-chloroethyl)vinylsilane, or ethoxy(2-chloroethyl)vinylsilane. From the viewpoints of reacting easily and obtaining the desired silicone (B-2-2) easily, it is preferable to use methoxydimethylvinylsilane (MeO—Si(Me)$_2$-CH=CH$_2$) or ethoxydimethylvinylsilane (EtO—Si(Me)$_2$-CH=CH$_2$).

<Disiloxane Containing Si—H Group>

If a disiloxane containing Si—H group and represented by the general formula (5-4) is concretely shown, it is possible to cite hexahydroxydisiloxane, 1,3-dimethyldisiloxane, 1,1,3,3-tetramethyldisiloxane, 1,3-diethyl-1,3-dimethyldisiloxane, 1,1,3,3-tetraethyldisiloxane, 1,1,3,3-tetrapropyldisiloxane, 1,3-diphenyldisiloxane, 1,3-diphenyl-1,3-dimethyldisiloxane, or 1,1,3,3-tetraphenyldisiloxane. From the viewpoints of reacting easily and obtaining the desired silicone (A-2-2) easily, it is preferable to use 1,1,3,3-tetramethyldisiloxane (H—Si(Me)$_2$-O—Si(Me)$_2$-H).

<Disiloxane Containing Si—CH=CH$_2$ Group>

If a disiloxane containing Si—CH=CH$_2$ group and represented by the general formula (7-4) is concretely shown, it is possible to cite 1,3-divinyldisiloxane, 1,3-dimethyl-1,3-divinyldisiloxane, 1,1,3,3-tetramethyl-1,3-divinyldisiloxane, 1,3-diethyl-1,3-dimethyl-1,3-divinyldisiloxane, 1,1,3,3-tetraethyl-1,3-divinyldisiloxane, 1,1,3,3-tetrapropyl-1,3-divinyldisiloxane, 1,3-diphenyl-1,3-divinyldisiloxane, 1,3-diphenyl-1,3-dimethyl-1,3-divinyldisiloxane, or 1,1,3,3-tetraphenyl-1,3-divinyldisiloxane. From the viewpoints of reacting easily and obtaining the desired silicone (B-2-2) easily, it is preferable to use 1,1,3,3-tetramethyldisiloxane (CH$_2$=CH—Si(Me)$_2$-O—Si(Me)$_2$-CH=CH$_2$).

In the curable composition of the present invention, it is selected from silicones (A-1), (A-2), (B-1), and (B-2) and they are mixed, thereby quantity of Si—OH is made 3.4 mass % or greater and 9.8 mass % or less, and the molar ratio of Si—H group to Si—CH=CH$_2$ group is adjusted to 4:1 to 1:1.

It foams in curing in the combination of only silicones (A-1) and (B-1), or adhesion to base body cannot be obtained when making a sealing material in the combination of only silicones (A-2) and (B-2). Therefore, in the curable composition of the present invention, a curable composition except for the combination of only silicones (A-1) and (B-1), and the combination of only silicones (A-2) and (B-2) is used.

4. Hydrosilylation Catalyst

Next, a hydrosilylation catalyst, which is essential in the curable composition of the present invention, and contains at least one metal compound selected from the group consisting of platinum compounds, palladium compounds, and rhodium compounds is explained.

In the curable composition of the present invention, the metal compound acts as a hydrosilylation catalyst in curing, that is, as it accelerates curing, a cured product which is excellent in hardness and heat resisting property can be obtained. The metal compound is at least one metal compound selected from the group consisting of platinum compounds, palladium compounds, and rhodium compounds. Concretely, as the platinum compounds, it is possible to cite platinum-carbonylvinylmethyl complex, platinum-divinyltetramethyldisiloxane complex, platinum-cyclovinylmethylsiloxane complex, or platinum-octylaldehyde complex. As the palladium compounds, it is possible to cite palladium-carbonylvinylmethyl complex, palladium-divinyltetramethyldisiloxane complex, palladium-cyclovinylmethylsiloxane complex, or palladium-octylaldehyde complex. As the rhodium compounds, it is possible to cite rhodium-carbonylvinylmethyl complex, rhodium-divinyltetramethyldisiloxane complex, rhodium-cyclovinylmethylsiloxane complex, or rhodium-octylaldehyde complex. In the curable composition of the present invention, these metal compounds may be used singly, or two kinds or greater of them may be used together. In the curable composition of the present invention, from the reasons that it has an easy availability, is excellent in hardness of the cured product, and deterioration of the cured product is little, it is preferable to use a platinum compound.

In the curable composition of the present invention, the content of the hydrosilylation catalyst is 0.1 ppm or greater and 200 ppm or less relative to the total amount of the silicones, which is the sum of silicone (A) and silicone (B), and preferably it is 0.5 ppm or greater and 30 ppm or less. In case that the hydrosilylation catalyst is less than 0.1 ppm, curing don't proceed well. In case that the hydrosilylation catalyst is more than 200 ppm, its heat resisting property lowers and the cured product is easy to turn yellow by heating.

5. Additive

Furthermore, additives such as various resins as filler, inorganic fine particles, and additive agents may be added within the range of not interfering with curing of the curable composition of the present invention and not spoiling performance of the cured product. As the objective to add the additives, it is possible to cite the improvement of mechanical strength and the improvement of water barrier property, etc.

As the resin, it is possible to cite polyimide resin, polyether resin, polyurethane resin, phenol resin, polyester resin, melamine resin, polyamide resin, or polyphenylene sulfide resin.

Furthermore, for the sake of the viscosity control in mold potting of the curable composition of the present invention or the improvement of heat resisting property, transparency, etc. of the cured product, inorganic fine particles may be added. As such inorganic fine particles, it is possible to cite silicon dioxide particles, colloidal silica, silica filler, aluminum oxide, zinc oxide, or zirconium phosphate tungsten. Preferably, silicon dioxide fine particles are preferable. For the sake of not spoiling transparency of the above cured product, it is preferable that particle diameter of these inorganic fine particles is 50 μm or less in maximum diameter. As these inorganic fine particles, it is possible to cite "Trade Name: Tospearl, made by Momentive Performance Materials Japan LLC", "Trade Name: WACKER HDK, made by Wacker Asahikasei Silicone Co., Ltd.", "Trade Name: AEROSIL, made by NIPPON AEROSIL CO., LTD.", "fused silica FB, made by DENKI KAGAKU KOGYO KABUSHIKI KAISHA".

As the additive agent, it is possible to cite ultraviolet absorber, antistatic agent, antioxidant, anti-yellowing agent, or the like.

In a sealing agent of optical system, the additive can be added within a range of not spoiling transparency. When its addition amount is represented by mass proportion to the total mass of the curable composition, it is preferably 50% or less, more preferably 20% or less.

6. Curing of the Curable Composition

By heating a curable composition of the present invention, curing proceeds with a silylation reaction in which Si—H group is combined with Si—CH=$CH_2$ group as a main reaction relative to the dehydration condensation reaction between Si—OH groups. In order to make the silylation reaction proceed, only (A-1) and (B-2), only (A-2) and (B-1) or at least three types of silicones are selected from the four types of silicones of (A-1), (A-2), (B-1) and (B-2), except for a combination of only (A-1) and (B-1) and a combination of only (A-2) and (B-2), and the content of Si—OH group is adjusted so as to be 3.4 mass % or greater and 9.8 mass % or less relative to the total amount of the curable composition, and the molar ratio of Si—H group to Si—CH=$CH_2$ group is adjusted so as to be 4:1 to 1:1.

Furthermore, by using a hydrosilylation catalyst containing at least one metal compound selected from the group consisting of platinum compounds, palladium compounds, and rhodium compounds, a cured product whose physical property is not deteriorated by passing of time can be obtained even if the curing temperature is 200° C. or lower.

The curing temperature when curing the curable composition is 70° C. or higher and 300° C. or lower. In case that the curing temperature is lower than 70° C., the cured product is hard to obtain hardness, so tackiness may be shown. The more the temperature is raised, the more curing proceeds. However, it is not practical that the curing temperature is more than 300° C. because of risk of foaming. Preferably, it is 80° C. or higher and 200° C. or lower. The heating time is 0.5 hours or longer and 12 hours or shorter. In case that the heating time is shorter than 0.5 hours, there is a risk that curing doesn't proceed completely. It is not necessary to heat for longer than 12 hours. More preferably, it is one hour or longer and 10 hours or shorter.

7. Cured Product

A cured product of the present invention has a favorable heat resisting property, transparency, low moisture permeability, and adhesion, and is suitably used for a sealing material for optical components such as LED and semiconductor laser or a sealing material for power semiconductor.

EXAMPLES

Although hereinafter the present invention is concretely described by examples, it doesn't mean that the present invention is limited by these examples.

<Weight-average Molecular Weight (Mw) Measurement>

Weight-average molecular weight (Mw) of the condensation product was measured in terms of polystyrene with the use of gel permeation chromatography (thereafter, it is abbreviated as "GPC", made by TOSOH CORPORATION, Product Name: HLC-8320GPC, column, made by TOSOH CORPORATION, Product Name: TSK gel Super HZ2000×4, 3000×2) and the use of tetrahydrofuran as the solvent.

<NMR (Nuclear Magnetic Resonance) Measurement>

1H-NMR and 29Si-NMR were measured with the use of a nuclear magnetic resonance device of a resonance frequency of 400 MHz (made by JEOL Ltd.). The amount of Si—OH was determined by 29Si-NMR.

<Method for Quantifying Si—H Group and Si-Vinyl Group>

20-30 mg of a measurement sample is taken into a sample tube of 6 mL, and the sample is dissolved by adding 0.8 mL of deuterated dichloromethane. After adding 2.0 μL of DMSO (0.0282 mmol) into the solution with a micro syringe, the sample tube is closed, and the solution is stirred. The solution is measured with 1H-NMR, and proton ratio of DMSO and proton ratios of Si—H group and vinyl group are calculated, and the numbers of moles of Si—H group and Si-vinyl in the sample taken are determined, and the amount of the functional group in 1 g of the sample is calculated by the following formula.

The calculated number of moles of the functional group (mmol)/the amount of the sample taken (mg)×1,000=the amount of the functional group in 1 g of the sample (mmol/g).

<Method for Quantifying Si—OH Group>

200 mg of a measurement sample was taken, and the sample was dissolved by adding 0.8 mL of deuterated chloroform. Furthermore, as a relaxation reagent, 10 mg of chromium(III) acetylacetonato complex was added there. The prepared solution was measured by $^{29}$Si-NMR. Peaks are assigned as follows and integrated ratios of respective peaks are calculated in terms of percentage.

−5 to −15 ppm: $Me_2SiO_{1/2}(OH)$, −15 to −25 ppm: $Me_2SiO_{2/2}$, −55 to −65 ppm: $PhSiO_{1/2}(OH)_2$, −65 to −75 ppm: $PhSiO_{2/2}(OH)$, −75 to −80 ppm: $PhSiO_{3/2}$, −85 to −95 ppm: $Si(OH)_2O_{2/2}$, −95 to −105 ppm: $Si(OH)O_{3/2}$, −105 to 115 ppm: $SiO_{4/22}$, 0 to −5 ppm: $Me_2Si(H)O_{1/2}$, −5 to −10 ppm: $Me_2Si(CH=CH_2)O_{1/2}$ The quantity of Si—OH was determined from the calculated integrated ratios by the following formulas.

(A)=(integrated ratio of $Me_2SiO_{1/2}(OH)$+integrated ratio of $PhSiO_{1/2}(OH)_2$×2+integrated ratio of $PhSiO_{2/2}(OH)$+integrated ratio of $Si(OH)_2O_{2/2}$×2+integrated ratio of $Si(OH)O_{3/2}$)×molecular weight of OH (17.01)

(B)=integrated ratio of $Me_2SiO_{1/2}(OH)$×molecular weight of $Me_2SiO_{1/2}(OH)$ (83.16)+integrated ratio of $Me_2SiO_{2/2}$×molecular weight of $Me_2SiO_{2/2}$(74.15)+integrated ratio of $PhSiO_{1/2}(OH)_2$×molecular weight of $PhSiO_{1/2}(OH)_2$ (147.2)+integrated ratio of $PhSiO_{2/2}(OH)$×molecular weight of $PhSiO_{2/2}(OH)$(138.2)+ integrated ratio of $PhSiO_{3/2}$×molecular weight of $PhSiO_{3/2}$(129.2)+integrated ratio of $Si(OH)_2O_{2/2}$+molecular weight of $Si(OH)_2O_{2/2}$(61.09)+ integrated ratio of $Si(OH)O_{3/2}$×molecular weight of $Si(OH)O_{3/2}$(69.10)+integrated ratio of $SiO_{4/2}$×molecular weight of $SiO_{4/2}$(60.09)+integrated ratio of $Me_2Si(H)O_{1/2}$×molecular weight of $Me_2Si(H)O_{1/2}$(67.16)+integrated ratio of $Me_2Si(CH=CH_2)O_{1/2}$×molecular weight of $Me_2Si(CH=CH_2)O_{1/2}$(93.20)

Quantity of Si—OH group wt %=(A)/(B)×100

When the peaks of $Me_2Si(H)O_{1/2}$ and $Me_2Si(CH=CH_2)O_{1/2}$ of $^{29}$Si-NMR overlap with the peak of $Me_2SiO_{1/2}(OH)$, $PhSi:Me_2Si(H)$ and $PhSi:Me_2Si(CH=CH_2)$ are determined by $^1$HNMR, and the integrated ratios of $^{29}$SiNMR of $Me_2Si(H)$ and $Me_2Si(CH=CH_2)$ are determined from the value of integrated ratio of $PhSiO_{1/2}(OH)_2$+integrated ratio of $PhSiO_{2/2}(OH)$+integrated ratio of $PhSiO_{3/2}$ of Si-NMR, and integrated ratios of $Me_2Si(H)$ and $Me_2Si(CH=CH_2)$ are subtracted from integrated value in which peaks of $Me_2Si(H)O_{1/2}$ and $Me_2Si(CH=CH_2)O_{1/2}$ overlap with a peak of $Me_2SiO_{1/2}(OH)$, and thereby a peak of $Me_2SiO_{1/2}(OH)$ is calculated.

<Viscosity Measurement>

Viscosity at 25° C. was measured by using a rotating viscometer (made by Brookfield Engineering Laboratories, Inc., Product Name: DV-II+PRO) and a temperature control unit (made by Brookfield Engineering Laboratories, Inc., Product Name: THERMOSEL).

<Light Transmittance>

It was measured by using an ultraviolet visible light spectrophotometer (made by Shimadzu Corporation, Model Number: UV-3150).

1. Synthesis of a Silicone by a Condensation Reaction of Alkoxysilane 1.1 Preparation of Silicone (A-1-1A)

148.3 g (1.00 mol) of $Me_2$-$Si(OEt)_2$, which was an alkoxysilane represented by the above general formula (1), 187.0 g (0.778 mol) of Ph-$Si(OEt)_3$, which was an alkoxysilane represented by the above general formula (2), and 73.0 g (0.444 mol) of H—$Si(OEt)_3$, which was an alkoxysilane represented by the above general formula (4), were taken into a three-neck flask having 2 L capacity and equipped with an impeller made of fluororesin and a Dimroth-type reflux device. Furthermore, Me is a methyl group, Et is an ethyl group, and Ph is a phenyl group. The same shall apply hereinafter.

Next, 224.0 g of 2-propanol, 168.0 g of water, and 0.12 g of acetic acid were added into the three-neck flask. A hydrolysis and condensation reaction was conducted by continuously heating the inside of the flask for 19 hours at 100° C. to obtain a reaction solution. After the reaction solution was restored to room temperature, it was transferred into a 2 L separatory funnel. After adding 400 mL of isopropyl ether and 400 mL of water into the separatory funnel and stirring it, an organic layer on the upper layer side of the reaction solution separated into two layers was collected, and it was washed with 400 mL of water. Next, after a very small quantity of water dissolved in isopropyl ether was removed by an adsorption onto magnesium sulfate, the magnesium sulfate was separated by filtration. Isopropyl ether was distilled out of the organic layer under reduced pressure by an evaporator. As a result, a silicone (A-1-1A) was obtained as a colorless viscous liquid. The yield of the silicone (A-1-1A) was 182.3 g, its Mw was 980, and its viscosity was 4,000 cP. The composition ratio of the product was $(Me_2SiO_{2/2})_{0.34}(PhSiO_{3/2})_{0.48}(HSiO_{3/2})_{0.18}$. The content of Si—H group was 1.79 mmol/g, and the content of Si—OH group was 12 mass %.

1.2 Polymerization of Silicone (A-1-1A) and Adjustment of (A-1-2A)

95 g of the silicone (A-1-1A) was taken into a 300 mL beaker. Next, the sample temperature was set at 92° C. in an oil bath, and by stirring it for 10 hours, (A-1-1A) was adjusted. By these operation, the weight-average molecular weight was raised from 980 to 7,500, and the viscosity was raised from 4,000 Cp to 60,000 Cp. The composition ratio of the product was $(Me_2SiO_{2/2})_{0.35}(PhSiO_{3/2})_{0.47}(HSiO_{3/2})_{0.18}$. The content of Si—H group was 1.81 mmol/g, and the content of Si—OH group was 10 mass %.

1.3 Preparation of Silicone (A-1-1B)

As a result of adding 10.4 g (0.05 mol) of Si(OEt)$_4$, which was an alkoxysilane represented by the above general formula (3), to the method of 1.1 and conducting operations by the same procedures as those when preparing silicone (A-1-1A), a silicone (A-1-1B), which was colorless and transparent, was obtained. The yield of the silicone (A-1-1B) was 205.3 g, its Mw was 1,050, and its viscosity was 7,000 cP. The composition ratio of the product was (Me$_2$SiO$_{2/2}$)$_{0.32}$(PhSiO$_{3/2}$)$_{0.46}$(HSiO$_{3/2}$)$_{0.18}$(SiO$_{4/2}$)$_{0.04}$. The content of Si—H group was 1.75 mmol/g, and the content of Si—OH group was 13 mass %.

1.4 Preparation of Silicone (B-1-1A)

In the raw materials described in 1.1, as a result of using 65.8 g (0.444 mol) of CH$_2$=CHSi(OMe)$_3$, which was an alkoxysilane represented by the above general formula (6), instead of H—Si(OEt)$_3$, and conducting operations by the same procedures as those when preparing silicone (A-1-1A), a silicone (B-1-1A), which was colorless and transparent, was obtained. The yield of the silicone (B-1-1A) was 201.2 g, its Mw was 980, and its viscosity was 2,900 cP. The composition ratio of the product was (Me$_2$SiO$_{2/2}$)$_{0.37}$(PhSiO$_{3/2}$)$_{0.41}$(CH$_2$=CHSiO$_{3/2}$)$_{0.22}$. The content of Si—CH=CH$_2$ group was 2.06 mmol/g, and the content of Si—OH group was 13 mass %.

1.5 Polymerization of Silicone (B-1-1A) and Adjustment of (B-1-2A)

(B-1-2A) was adjusted by conducting operations on the silicone (B-1-1A) similar to procedures of the above 1.2. The weight-average molecular weight was raised from 890 to 2,600, and the viscosity was raised from 2,900 Cp to 61,000 Cp. The composition ratio of the product was (Me$_2$SiO$_{2/2}$)$_{0.36}$(PhSiO$_{3/2}$)$_{0.42}$(CH$_2$=CHSiO$_{3/2}$)$_{0.23}$. The content of Si—CH=CH$_2$ group was 2.16 mmol/g, and the content of Si—OH group was 11 mass %.

1.6 Preparation of Silicone (B-1-1B)

As a result of using 65.8 g (0.444 mol) of CH$_2$=CHSi(OMe)$_3$, which was an alkoxysilane represented by the above general formula (6), instead of H—Si(OEt)$_3$, and adding 10.4 g (0.05 mol) of Si(OEt)$_4$, which was an alkoxysilane represented by the above general formula (3), to the method of 1.1 and conducting operations by the same procedures as those when preparing silicone (A-1-1A), a silicone (B-1-1B), which was colorless and transparent, was obtained. The yield of the silicone (B-1-1B) was 203.6 g, its Mw was 1,030, and its viscosity was 8,000 cP. The composition ratio of the product was (Me$_2$SiO$_{2/2}$)$_{0.36}$(PhSiO$_{3/2}$)$_{0.40}$(CH$_2$=CHSiO$_{3/2}$)$_{0.21}$(SiO$_{4/2}$)$_{0.03}$. The content of Si—CH=CH$_2$ group was 2.02 mmol/g, and the content of Si—OH group was 14 mass %.

2. Introduction of Si—H or Si—CH=CH$_2$ Group by Chlorosilane, and Preparation of Silicones (A-2-1A) and (B-2-1A)

First, after a precursor silicone (A-2-I) was prepared by conducting condensation of an alkoxysilane, its molecular weight and viscosity were adjusted by stirring it with heating at 100-150° C. and thereby a precursor (A-2-II) was obtained. Furthermore, a silicone (A-2-1A) or (B-2-1A) was synthesized by reacting with a chlorosilane containing Si—H or Si—CH=CH$_2$ group.

2.1 Preparation of Precursor (A-2-I)

A precursor (A-2-I) of silicone (A-2-A1) was prepared.

148.3 g (1.00 mol) of Me$_2$-Si(OEt)$_2$ as an alkoxysilane represented by the above general formula (1), and 240.1 g (1.00 mol) of Ph-Si(OEt)$_3$ as an alkoxysilane represented by the above general formula (4) were taken into a four-neck flask having a capacity of 2 L and equipped with an impeller made of fluororesin and a Dimroth-type reflux device. Next, 240.51 g of 2-propanol, 181.01 g (10.0 mol) of water, and 0.13 g of acetic acid were added into the four neck-flask, and hydrolysis and condensation reaction were conducted by heating the inside of the flask at 100° C. After 18 hours, the reaction solution (reaction system) was restored to room temperature, and it was transferred into a separatory funnel having a capacity of 2 L. After adding 400 mL of isopropyl ether and 400 mL of water into the separatory funnel and stirring it, the upper layer side (organic layer) of the reaction solution separated into two layer was collected, and it was washed twice with 200 mL of water. Next, after a very small quantity of water dissolved in isopropyl ether was removed by magnesium sulfate, the magnesium sulfate was separated by filtration. Isopropyl ether was distilled off under reduced pressure by an evaporator, and thereby a precursor (A-2-I) was obtained as a condensation product which was a colorless viscous liquid. The yield of the precursor (A-2-I) was 204.40 g, its Mw=900, and its viscosity was 2,600 Cp. The composition ratio of the product was (Me$_2$SiO$_{2/2}$)$_{0.44}$(PhSiO$_{3/2}$)$_{0.56}$. The content of Si—OH group was 13.7 mass %.

2.2 Preparation of Precursor (A-2-II)

A precursor (A-2-II) was prepared from precursor (A-2-I).

170 g of the above precursor (A-2-I) was taken into a 500 mL beaker, and it was continuously heated for 10 hours while setting the temperature at 93° C. in an oil bath. Next, it was continuously heated for 10 hours with stirring while setting the temperature so as to be 110° C. By these operations, the weight-average molecular weight was raised from 900 to 3,700, and the viscosity was raised from 2,600 Cp to 2,376,000 Cp. The content of Si—OH group was 8.7 mass %. The composition ratio of the product was (Me$_2$SiO$_{2/2}$)$_{0.37}$(PhSiO$_{3/2}$)$_{0.63}$.

2.3 Synthesis of Silicone (A-2-1A)

80 g of the above polymerized precursor (A-2-II) (molecular weight: 3,700, viscosity: 2,376,000 Cp, Si—OH group: 8.7 mass %) was added into a 1 L three-neck eggplant flask, which was equipped with a dropping funnel, a septum, and a T-shaped tube, and in which a stirring bar was put, and air in the vessel was removed by a vacuum pump. Afterward, the vessel was made to be filled with nitrogen. After the substrate was dissolved by adding 600 mL of dehydrated diethyl ether into the reaction vessel, 86.4 mL (620 mmol) of trimethylamine was added thereto. After that, the solution was cooled in an iced bath, and 65.3 mL (600 mmol) of chlorodimethylsilane was added dropwise. After stirring for 2 hours while keeping the temperature at 5° C., the reaction solution was poured into a 2 L conical flask charged with 400 mL of distilled water. The reaction vessel was washed with a use of 400 mL of distilled water, and next 100 mL of diethyl ether. These solutions were put together into a separatory funnel, and the upper layer side (organic layer) of the reaction solution separated into two layer was collected, and it was washed with 200 mL of 1N HCl aqueous solution and next with 100 mL of saturated NaHCO$_3$ aqueous solution, and furthermore it was washed twice with 200 mL of distilled water. After a very small quantity of water dissolved in diethyl ether was removed by magnesium sulfate, the magnesium sulfate was separated by filtration. Diethyl ether was distilled off under reduced pressure by an evaporator, and thereby a silicone (A-2-1A) was obtained as a colorless viscous liquid. The yield of the condensation product was 82.53 g, its Mw=3,700, and its viscosity was 6,000 Cp. The composition ratio of the product was (Me$_2$SiO$_{2/2}$)$_{0.33}$(PhSiO$_{3/2}$)$_{0.50}$(Me$_2$HSiO$_{1/2}$)$_{0.17}$. The content of Si—H group was 1.58 mmol/g, and the content of Si—OH group was 3.0 mass %.

2.4 Synthesis of Silicone (B-2-1A) with a Use of Chlorosilane

By using 40.7 mL (300 mmol) of chlorodimethylvinylsilane instead of chlorodimethylsilane and conducting the same operations as those when preparing silicone (A-2-1A), a silicone (B-2-1A), which was colorless and transparent, was obtained. The yield of the silicone (B-2-1A) was 44.7 g, its Mw=3,700, and its viscosity was 12,000. The composition ratio of the product was $(Me_2SiO_{2/2})_{0.35}(PhSiO_{3/2})_{0.50}(CH_2=CHSiO_{3/2})_{0.15}$. The content of Si—CH=CH$_2$ group was 1.74 mmol/g, and the content of Si—OH group was 3.0 mass %.

3. Introduction of Si—H or Si—CH=CH$_2$ Group by an Acid Cleavage Reaction of Disiloxane, and Preparations of Silicones (A-2-2A), (B-2-2A), (A-2-2B), and (B-2-2B)

3.1 Synthesis of Silicone (A-2-2A)

After a precursor silicone (A-2-I) was prepared by conducting a condensation of the alkoxysilane by the same procedures as those in the preceding item, its molecular weight and viscosity were adjusted by heating at 100-150° C. with stirring, and thereby a precursor (A-2-II) was obtained. Furthermore, a silicone (A-2-2A) was synthesized by reacting with a disiloxane containing Si—H group.

28.91 g of the precursor (A-2-II), 71.6 g of toluene, 25.12 g of methanol, 5.91 g (0.044 mol) of 1,1,3,3-tetramethyldisiloxane, and 0.1 mL of concentrated nitric acid were added into a four-neck flask, and they were reacted at room temperature. After 4 hours, they were transferred into a 1 L separatory funnel. After adding 75 mL of water into the separatory funnel and stirring it, the upper layer side (organic layer) of the reaction solution separated into two layer was collected. The same operation was repeated four times for washing. Afterward, as a result of conducting a vacuum distillation, a silicone (A-2-2A) was obtained as a colorless viscous liquid. The yield of the silicone (A-2-2A) was 26.8 g, its Mw=3,000, and its viscosity was 2,400 cP. The composition ratio of the product was $(Me_2SiO_{2/2})_{0.36}(PhSiO_{3/2})_{0.45}(Me_2SiO_{1/2}H)_{0.19}$. Si—H was 2.18 mmol/g, and the content of Si—OH group was 2.2 mass %.

3.2 Synthesis of Silicone (B-2-2A)

By using 5.83 g (0.031 mol) of 1,3-divinyl-1,1,3,3,-tetramethyldisiloxane instead of 1,1,3,3-tetramethyldisiloxane and conducting the same operations as those when preparing silicone (A-2-2A), a silicone (B-2-2A), which was colorless and transparent, was obtained. The yield of the silicone (B-2-2A) was 28.0 g, its Mw=2,800, and its viscosity was 8,500 cP. The composition ratio of the product was $(Me_2SiO_{2/2})_{0.30}(PhSiO_{3/2})_{0.56}(CH_2=CHSi(Me)_2O_{1/2})$. Si—CH=CH$_2$ was 1.10 mmol/g, and the content of Si—OH group was 2.7 mass %.

3.3 Synthesis of (A-2-2B)

In synthesizing (A-2-I) in the above 2.1, by adding 10.4 g (0.05 mol) of Si(OEt)$_4$, which was an alkoxysilane represented by the above general formula (3), to the method and subsequently conducting the same operations by procedures described in 2.1, 2.2, and 3.1, a silicone (A-2-2B), which was colorless and transparent, was synthesized. The viscosity of the product was 10,000 Cp. Its composition ratio was $(Me_2SiO_{2/2})_{0.30}(PhSiO_{3/2})_{0.50}(HSi(Me)_2O_{3/2})_{0.15}(SiO_{4/2})_{0.05}$. The content of Si—H group was 1.80 mmol/g, and the content of Si—OH group was 3.1 mass %.

3.4 Synthesis of (B-2-2B)

In synthesizing (A-2-I) in the above 2.1, by adding 10.4 g (0.05 mol) of Si(OEt)$_4$, which was an alkoxysilane represented by the above general formula (3), to the method and subsequently conducting the same operations by procedures described in 2.1, 2.2, and 3.2, a silicone (B-2-2B), which was colorless and transparent, was synthesized. The viscosity of the product was 12,000 Cp. Its composition ratio was $(Me_2SiO_{2/2})_{0.31}(PhSiO_{3/2})_{0.49}(CH_2=CHSi(Me)_2O_{3/2})_{0.15}(SiO_{4/2})_{0.05}$. The content of Si—H group was 1.77 mmol/g, and the content of Si—OH group was 3 mass %.

6. Examples and Comparative Examples

Examples 1-19

By combining 12 types of silicones which were synthesized silicones (A-1-1A), (A-1-2A), (A-1-1B), (B-1-1A), (B-1-2A) and (B-1-1B), and silicones (A-2-1A), (A-2-2A), (A-2-2B), (B-2-1A), (B-2-2A) and (B-2-2B), and adding 0.03 mass % platinum(0)-1,3-divinyl-1,1,3,3-tetramethyldisiloxane complex xylene solution (Karstedt's catalyst) as a hydrosilylation catalyst, curable compositions of Examples 1-19 having combinations shown in Table 1 were prepared. The silanol amount in the curable compositions has been adjusted to 3.4 mass % or greater and 9.8 mass % or less.

Comparative Examples 1-19

As shown in Table 2, curable compositions of Comparative Examples 1-19 which were out of the scope of the present invention were prepared. In Comparative Example 1, a thermal curing was conducted with the use of the above-mentioned silicone precursor (A-2-I). In Comparative Examples 2-4, they were cured by heating with the combinations of silicone (A-2-1A) and silicone (B-2-1A), of (A-2-2A) and silicone (B-2-2A), and of silicone (A-2-2B) and silicone (A-2-2B) with no catalyst. In Comparative Examples 5-7, they were cured by using a hydrosilylation catalyst with the combinations of silicone (A-2-1A) and silicone (B-2-1A), of (A-2-2A) and silicone (B-2-2A), and of silicone (A-2-2B) and silicone (A-2-2B). In Comparative Examples 8-10, they were cured by heating with the combinations of silicone (A-1-1A) and silicone (B-1-1A), of silicone (A-1-2A) and silicone (B-1-2A), and of silicone (A-1-1B) and silicone (B-1-1B) with no catalyst. In Comparative Examples 11-13, they were cured by heating with the combinations of silicone (A-1-1A) and silicone (B-1-1A), of silicone (A-1-2A) and silicone (B-1-2A), and of silicone (A-1-1B) and silicone (B-1-1B) while using a hydrosilylation catalyst. The silanol amounts after the mixing of Comparative Examples 1-13 have been adjusted so as to be less than 3.4 mass % or more than 9.8 mass %. In Comparative Examples 14-19, although it has been adjusted that Si—OH group is 3.4 mass % or greater and 9.8 mass % or less, the molar ratio of Si—OH group:Si—CH=CH$_2$ group is out of the range of 4:1 to 1:1.

Regarding the curing condition, in case that the content of Si—OH group to the total amount of the curable composition was less than 5.0 mass %, it was continuously heated under 150° C. for 6 hours. This condition was treated as "Curing condition A" in Table 1 and Table 2. In case that the content of Si—OH group to the total amount of the curable composition was 5.0 mass % or greater, after it was continuously heated under 90° C. for 7 hours, the temperature was gradually raised, and it was heated under 150° C. for an hour, and the temperature was raised further, and it was continuously heated under 200° C. for an hour. This condition was treated as "Curing condition B" in Table 1 and Table 2.

In detail, the curable compositions shown in Examples 1-19 of Table 1 and Comparative Examples 1-19 of Table 2 were poured into glass dishes of 22 mm in diameter under room temperature. Furthermore, regarding curable compositions of Examples 1-3, 6-8 and 15-17 and Comparative Examples 2-7 and 14-19, cured products were obtained by Curing condition A. Furthermore, regarding curable compositions of Examples 4-5, 9-14 and 18-19 and Comparative Examples 1 and 8-13, cured products were obtained by Curing condition B. All of these compositions had fluidity at room temperature, so it was easy to pour them into molds. Si—OH group, Si—H group and Si—CH=CH$_2$ group, which are described in Table 1 and Table 2, were those that the contents of Si—OH group, Si—H group and Si—CH=CH$_2$ group contained in a silicone after mixing all sorts of silicones were calculated from measured values of each silicone in percentage by mass or mmol/g.

TABLE 1

| Curable Composition | Silicone (mass %) | | | | Hydrosilylation catalyst (ppm) | Si—OH group mass % | Si—H group mmol/g | Si—CH=CH$_2$ group mmol/g | Curing Condition |
|---|---|---|---|---|---|---|---|---|---|
| | A-1 | A-2 | B-1 | B-2 | | | | | |
| Example 1 | A-1-1A 3 | A-2-1A 64 | B-1-1A 2 | B-2-1A 31 | 2 | 3.47 | 1.06 | 0.58 | A |
| Example 2 | A-1-1A 15 | A-2-1A 52 | None | B-2-1A 33 | 2 | 4.35 | 1.09 | 0.57 | A |
| Example 3 | None | A-2-1A 66 | B-1-1A 10 | B-2-1A 24 | 2 | 4.00 | 1.04 | 0.62 | A |
| Example 4 | None | A-2-1A 67 | B-1-1A 33 | None | 2 | 6.30 | 1.06 | 0.68 | B |
| Example 5 | None | A-2-1A 67 | B-1-2A 33 | None | 2 | 5.64 | 1.06 | 0.71 | B |
| Example 6 | A-1-1A 10 | A-2-2A 57 | B-1-1A 3 | B-2-2A 30 | 2 | 3.65 | 1.42 | 0.39 | A |
| Example 7 | A-1-1A 15 | A-2-2A 52 | None | B-2-2A 33 | 2 | 3.84 | 1.40 | 0.36 | A |
| Example 8 | None | A-2-2A 66 | B-1-1A 10 | B-2-2A 24 | 2 | 3.40 | 1.44 | 0.47 | A |
| Example 9 | None | A-2-2A 67 | B-1-1A 33 | None | 2 | 5.76 | 1.46 | 0.68 | B |
| Example 10 | None | A-2-2A 67 | B-1-2A 33 | None | 2 | 5.10 | 1.46 | 0.71 | B |
| Example 11 | A-1-1A 67 | None | None | B-2-1A 33 | 2 | 9.03 | 1.20 | 0.57 | B |
| Example 12 | A-1-1A 67 | None | None | B-2-2A 33 | 2 | 8.93 | 1.20 | 0.36 | B |
| Example 13 | A-1-2A 67 | None | None | B-2-1A 33 | 2 | 7.69 | 1.21 | 0.57 | B |
| Example 14 | A-1-2A 67 | None | None | B-2-2A 33 | 2 | 7.59 | 1.21 | 0.36 | B |
| Example 15 | A-1-1B 3 | A-2-2B 64 | B-1-1B 2 | B-2-2B 31 | 2 | 3.58 | 1.20 | 0.59 | A |
| Example 16 | A-1-1B 7 | A-2-2B 60 | None | B-2-2B 33 | 2 | 3.76 | 1.20 | 0.58 | A |
| Example 17 | None | A-2-2B 66 | B-1-1B 10 | B-2-2B 24 | 2 | 4.17 | 1.19 | 0.63 | A |
| Example 18 | None | A-2-2B 67 | B-1-1B 33 | None | 2 | 6.70 | 1.21 | 0.67 | B |
| Example 19 | A-1-1A 67 | None | None | B-2-2B 33 | 2 | 9.70 | 1.17 | 0.58 | B |

Curing Condition A: heating at 150° C. for 6 hours
Curing Condition B: after heating at 90° C. for 7 hours, heating at 150° C. for an hour, and furthermore heating at 200° C. for an hour

TABLE 2

| Curable Composition | Silicone (mass %) | | | | Hydrosilylation catalyst (ppm) | Si—OH group mass % | Si—H group mmol/g | Si—CH=CH$_2$ group mmol/g | Curing Condition |
|---|---|---|---|---|---|---|---|---|---|
| | A-1 | A-2 | B-1 | B-2 | | | | | |
| Comparative Example 1 | None | A-2-I 100 | None | None | None | 10.0 | 0 | 0 | B |
| Comparative Example 2 | None | A-2-1A 67 | None | B-2-1A 33 | None | 3.00 | 1.06 | 0.57 | A |
| Comparative Example 3 | None | A-2-2A 67 | None | B-2-2A 33 | None | 2.37 | 1.46 | 0.36 | A |
| Comparative Example 4 | None | A-2-2B 67 | None | B-2-2B 33 | None | 3.07 | 1.21 | 0.58 | A |
| Comparative Example 5 | None | A-2-1A 67 | None | B-2-1A 33 | 2 | 3.00 | 1.06 | 0.57 | A |
| Comparative Example 6 | None | A-2-2A 67 | None | B-2-2A 33 | 2 | 2.37 | 1.46 | 0.36 | A |
| Comparative Example 7 | None | A-2-2B 67 | None | B-2-2B 33 | 2 | 3.07 | 1.21 | 0.58 | A |

TABLE 2-continued

| Curable Composition | Silicone (mass %) A-1 | A-2 | B-1 | B-2 | Hydrosilylation catalyst (ppm) | Si—OH group mass % | Si—H group mmol/g | Si—CH=CH$_2$ group mmol/g | Curing Condition |
|---|---|---|---|---|---|---|---|---|---|
| Comparative Example 8 | A-1-1A 67 | None | B-1-1A 33 | None | None | 12.3 | 1.20 | 0.68 | B |
| Comparative Example 9 | A-1-2A 67 | None | B-1-2A 33 | None | None | 10.3 | 1.21 | 0.71 | B |
| Comparative Example 10 | A-1-1B 67 | None | B-1-1B 33 | None | None | 13.3 | 1.17 | 0.67 | B |
| Comparative Example 11 | A-1-1A 67 | None | B-1-1A 33 | None | 2 | 12.3 | 1.20 | 0.68 | B |
| Comparative Example 12 | A-1-2A 67 | None | B-1-2A 33 | None | 2 | 10.3 | 1.21 | 0.71 | B |
| Comparative Example 13 | A-1-1B 67 | None | B-1-1B 33 | None | 2 | 13.3 | 1.17 | 0.67 | B |
| Comparative Example 14 | A-1-1A 10 | A-2-1A 80 | None | B-2-1A 10 | 2 | 3.90 | 1.44 | 0.17 | A |
| Comparative Example 15 | A-1-1A 10 | A-2-2A 80 | None | B-2-2A 10 | 2 | 3.23 | 1.92 | 0.11 | A |
| Comparative Example 16 | A-1-1B 10 | A-2-2B 80 | None | B-2-2B 10 | 2 | 4.08 | 1.62 | 0.18 | A |
| Comparative Example 17 | A-1-1A 20 | A-2-1A 20 | None | B-2-1A 60 | 2 | 4.80 | 0.67 | 1.04 | A |
| Comparative Example 18 | A-1-1A 20 | A-2-2A 10 | None | B-2-2A 70 | 2 | 4.51 | 0.58 | 0.77 | A |
| Comparative Example 19 | A-1-1B 20 | A-2-2B 20 | None | B-2-2B 60 | 2 | 5.02 | 0.71 | 1.06 | A |

Curing Condition A: heating at 150° C. for 6 hours
Curing Condition B: after heating at 90° C. for 7 hours, heating at 150° C. for an hour, and furthermore heating at 200° C. for an hour

[Transparency and Heat Resisting Property Evaluation of the Cured Products]

External appearance of the cured products of Examples 1 to 19, which had been obtained under combinations and curing conditions described in Table 3, was checked, and their light transmittance in the wavelength of 400 nm, tack, and adhesion between the cured product and a glass mold were evaluated. Furthermore, for evaluating heat resisting property of the cured product, a continuous heating was conducted at a temperature of 200° C. for 200 hours, and then external appearance after the heating was checked, and light transmittance in the wavelength of 400 nm was measured. Furthermore, in the external appearance of Table 2, "good" means a state that it has transparency and has no foaming and no crack, and "foamed" means a state that bubbles are observed in the cured product, and "uncured" means a state that it is an adhesive solid due to imperfect curing. Furthermore, regarding "good" of adhesion, in getting out a cured product after curing from a mold, one peeled off easily has been evaluated as "easily peeled", and one not peeled off easily has been evaluated as "adhered".

TABLE 3

| Cured Product | Cured Product (before heat-resistance test) | | | | after heat-resistance test | |
|---|---|---|---|---|---|---|
| | External Appearance | Transmittance 400 nm | Tack | Adhesion | External Appearance | Transmittance 400 nm |
| Example 1 | good | 89 | absent | adhered | good | 83 |
| Example 2 | good | 89 | absent | adhered | good | 83 |
| Example 3 | good | 89 | absent | adhered | good | 83 |
| Example 4 | good | 89 | absent | adhered | good | 84 |
| Example 5 | good | 89 | absent | adhered | good | 83 |
| Example 6 | good | 89 | absent | adhered | good | 85 |
| Example 7 | good | 89 | absent | adhered | good | 83 |
| Example 8 | good | 89 | absent | adhered | good | 83 |
| Example 9 | good | 89 | absent | adhered | good | 84 |
| Example 10 | good | 89 | absent | adhered | good | 84 |
| Example 11 | good | 89 | absent | adhered | good | 84 |
| Example 12 | good | 89 | absent | adhered | good | 84 |
| Example 13 | good | 89 | absent | adhered | good | 84 |
| Example 14 | good | 89 | absent | adhered | good | 85 |
| Example 15 | good | 89 | absent | adhered | good | 84 |
| Example 16 | good | 89 | absent | adhered | good | 84 |
| Example 17 | good | 89 | absent | adhered | good | 83 |
| Example 18 | good | 89 | absent | adhered | good | 84 |
| Example 19 | good | 89 | absent | adhered | good | 85 |
| Com. Ex 1 | foamed | | present | adhered | | |
| Com. Ex 2 | foamed | | present | adhered | | |
| Com. Ex 3 | foamed | | present | adhered | | |
| Com. Ex 4 | foamed | | present | adhered | | |
| Com. Ex 5 | good | 89 | absent | easily peeled | | |

TABLE 3-continued

| Cured Product | Cured Product (before heat-resistance test) | | | | after heat-resistance test | |
|---|---|---|---|---|---|---|
| | External Appearance | Transmittance 400 nm | Tack | Adhesion | External Appearance | Transmittance 400 nm |
| Com. Ex 6 | good | 89 | absent | easily peeled | | |
| Com. Ex 7 | good | 89 | absent | easily peeled | | |
| Com. Ex 8 | foamed | | present | adhered | | |
| Com. Ex 9 | foamed | | present | adhered | | |
| Com. Ex 10 | foamed | | present | adhered | | |
| Com. Ex 11 | foamed | | absent | adhered | | |
| Com. Ex 12 | foamed | | absent | adhered | | |
| Com. Ex 13 | foamed | | absent | adhered | | |
| Com. Ex 14 | uncured | | present | adhered | | |
| Com. Ex 15 | uncured | | present | adhered | | |
| Com. Ex 16 | uncured | | present | adhered | | |
| Com. Ex 17 | good | 89 | absent | adhered | yellowed | 50 |
| Com. Ex 18 | good | 89 | absent | adhered | yellowed | 65 |
| Com. Ex 19 | good | 89 | absent | adhered | yellowed | 55 |

As shown in Table 3, in the obtained cured products of Examples 1-19, foaming and cracks were not observed in each of them before the heat-resistance test, so they had good conditions in external appearance. Furthermore, they had no tackiness but had transparency, and each of them was 89% in light transmittance in the wavelength of 400 nm. Furthermore, they maintained good conditions in external appearance also after the heat-resistance test that a cured product had been continuously heated at 200° C. for 200 hours, and their light transmittance in the wavelength of 400 nm maintained high values which were 83-85%.

In this way, cured products made by curing curable compositions of Examples 1-19 of the present invention were transparent without generating neither foaming nor cracks, and furthermore they are also good in tack and adhesion. Also after the heat-resistance test, the appearance was good, and the transparency was also maintained.

In the curable composition of Comparative Example 1, foaming and tack were found in the cured product. It was found that the curable composition of Comparative Example 1 cured by only a dehydration condensation of Si—OH group was inferior in formability. The curable compositions of Comparative Examples 2, 3, and 4 are silicones that the Si—OH content has been adjusted so as to be less than 3.4 mass %, and they have Si—OH group and Si—CH═CH$_2$ group which are involved in hydrosilylation, but they are in a condition of no catalyst. In this condition, dehydration condensation proceeded preferentially, and foaming and tack were observed in the cured product. The curable compositions of Comparative Example 8, 9, and 10 are silicones that the Si—OH content has been adjusted so as to be more than 9.8 mass %, and they are in a condition in which catalyst doesn't exist, and foaming and tack were observed.

As hydrosilylation catalyst existed in Comparative Examples 5, 6, and 7, hydrosilylation proceeded preferentially and a cured product having a good external appearance was obtained. However, as its adhesion was weak, the cured product was easy to come off a mold. Although hydrosilylation catalyst existed in Comparative Examples 8, 9, and 10, Si—OH content was more than 9.8 mass %. Therefore, it is considered that foaming was generated by strengthening the influence of dehydration condensation of Si—OH group on hydrosilylation reaction.

In Comparative Examples 14, 15, and 16, adhesive solids, which had uncured appearance and tack, were obtained. It is considered that in these conditions in which the molar ratio of Si—H group:Si-Vinyl group was in 8:1 to 17:1, hydrosilylation didn't proceed preferentially, so it became uncured.

In Comparative Examples 17, 18, and 19, good cured products were obtained and they adhered to a glass mold. However, cured products after the heat-resistance test had turned yellow. It is considered that in these conditions in which the molar ratio of Si—H group:Si-Vinyl group was in a range of 1:0.6 to 1:0.8, heat resisting property of the cured product was decreased.

From these results, it was found that by adjusting the Si—OH group content in the curable composition to 3.4 mass % or greater and 9.8 mass % or less, formability of the cured product and its adhesion to substrate of the cured product can be obtained, and regarding a glass substrate, if the content of Si—OH group is 3.4 mass % or more, good adhesion can be obtained. Therefore, to obtain a good cured product without foaming, like curable compositions of the present invention of Examples 1-19, it was found that it is effective to conduct curing by hydrosilylation while adjusting the Si—OH group content of the curable composition in the range of 3.4 mass % or greater and 9.8 mass % or less, and adjusting the molar ratio of Si—H group Si-Vinyl group to 4:1 to 1:1. Furthermore, in adhesion to a base body of the cured product to substrate, it was found that it is preferable that the content of Si—OH group to the total amount of the curable composition is 3.4 mass % or greater.

The invention claimed is:

1. A curable composition, comprising:
  (1) a silicone (A) containing Si—OH group and Si—H group,
  (2) a silicone (B) containing Si—OH group and Si—CH═CH$_2$ group, and
  (3) a hydrosilylation catalyst of a catalyst amount, containing at least one metal compound selected from the group consisting of platinum compounds, palladium compounds, and rhodium compounds,
  wherein
  (a): the silicone (A) is the following silicone (A-1) and/or silicone (A-2), the silicone (B) is the following silicone (B-1) and/or silicone (B-2), in case that the silicone (A) consists of the silicone (A-1), the silicone (B) comprises at least the silicone (B-2), and in case that the silicone (A) consists of the silicone (A-2), the silicone (B) comprises at least the silicone (B-1),
  (b): a molar ratio of Si—H group to the Si—CH═CH$_2$ group in the silicone (A) and the silicone (B) which are contained in the curable composition is in a range of 4:1 to 1:1, and (c): in the curable composition, a content of Si—OH group relative to a total amount of the curable composition is 3.4 mass % or greater and 9.8 mass % or less, a content of Si—H group is 0.1 mmol/g or greater and 5.0 mmol/g or less in molar content relative to the curable composition, and a content of Si—CH=CH$_2$ group is 0.1 mmol/g or greater and 5.0 mmol/g or less, wherein (i) Silicone (A-1) is a silicone containing 10 mass % or greater of Si—OH group relative to a total amount of the silicone (A-1), which is obtained by hydrolysis and polycondensation of at least one alkoxysilane selected from the group consisting of an alkoxysilane represented by the general formula (1), (2), and (3):

R$^1$R$^2$Si(OR$^3$)$_2$, (1)

R$^4$Si(OR$^5$)$_3$, and (2)

Si(OR$^6$)$_4$; (3)

with an alkoxysilane represented by the general formula (4)

H—Si(OR$^7$)$_3$ (4)

under an acid condition or a basic condition, wherein (ii) Silicone (A-2) is a silicone containing 3.3 mass % or less of Si—OH group relative to a total amount of the silicone (A-2), which is obtained by reacting a reaction product containing Si—OH group and obtained by hydrolysis and polycondensation, under an acid condition or a basic condition, of at least one alkoxysilane selected from the group consisting of an alkoxysilane represented by the general formula (1), (2), and (3):

R$^1$R$^2$Si(OR$^3$)$_2$, (1)

R$^4$Si(OR$^5$)$_3$, and (2)

Si(OR$^6$)$_4$; (3)

with at least one silane compound containing Si—H group selected from the group comprising a silane compound containing Si—H group represented by the general formula (5-1), the general formula (5-2), the general formula (5-3), or the general formula (5-4)

(5-1)

(5-2)

(5-3)

(5-4)

wherein (iii) silicone (B-1) is a silicone containing 10 mass % or greater of Si—OH group to a total amount of the silicone (B-1), which is obtained by hydrolysis and polycondensation of at least one alkoxysilane selected from the group consisting of an alkoxysilane represented by the general formula (1), (2), and (3):

R$^1$R$^2$Si(OR$^3$)$_2$, (1)

R$^4$Si(OR$^5$)$_3$, and (2)

Si(OR$^6$)$_4$; (3)

with an alkoxysilane represented by the general formula (6)

CH$_2$=CH—Si(OR$^8$)$_3$ (6)

under an acid condition or a basic condition, wherein (iv) Silicone (B-2) is a silicone containing 3.3 mass % or less of Si—OH group relative to a total amount of the silicone (B-2), which is obtained by reacting a reaction product containing Si—OH group and obtained by hydrolysis and polycondensation, under an acid condition or a basic condition, of at least one alkoxysilane selected from a group consisting of an alkoxysilane represented by the general formula (1), (2), and (3):

R$^1$R$^2$Si(OR$^3$)$_2$, (1)

R$^4$Si(OR$^5$)$_3$, and (2)

Si(OR$^6$)$_4$ (3)

with at least one compound selected from the group consisting of a silane compound containing Si—CH=CH$_2$ group represented by the general formula (7-1), the general formula (7-2), the general formula (7-3), or the general formula (7-4)

(7-1)

(7-2)

(7-3)

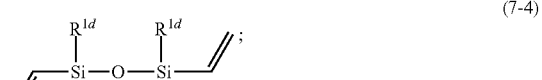

(7-4)

wherein
each of R$^1$ and R$^2$ is a hydrogen atom, a fluorine atom, a hydroxyl group, an alkyl group which is C$_{1-6}$ straight-chain, C$_{3-6}$ branched-chain, or C$_{3-6}$ cyclic, or an aryl group which is C$_{6-15}$, in the alkyl group or aryl group, a part of or all of hydrogen atoms may be replaced with fluorine atom, a part of carbon atoms may be replaced with oxygen atom or nitrogen atom, $R^3$ is a methyl group, an ethyl group, or an isopropyl group $R^4$ is a hydrogen atom, a fluorine atom, a hydroxyl group, an alkyl group which is $C_{1-6}$ straight-chain, $C_{3-6}$ branched-chain, or $C_{3-6}$ cyclic, or an aryl group which is $C_{6-15}$, in the alkyl group or aryl group, a part of or all of hydrogens atom may be replaced with fluorine atom, a part of carbon atoms may be replaced with oxygen atom or nitrogen atom, $R^5$ is a methyl group, an ethyl group, or an isopropyl group $R^6$ is a methyl group, an ethyl group, or an isopropyl group $R^7$ is a methyl group, an ethyl group, or an isopropyl group each of $R^{1a}$ and $R^{1b}$ is independently a fluorine atom, an alkyl group which is $C_{1-6}$ straight-chain, $C_{3-6}$ branched-chain, or $C_{3-6}$ cyclic, or aryl group which is $C_{6-15}$, furthermore in the alkyl group or an aryl group, a part of or all of hydrogen atoms may be replaced with fluorine atom, a part of carbon atoms may be replaced with oxygen atom or nitrogen atom, $R^{1c}$ is a methyl group, an ethyl group, or an isopropyl group $R^8$ is a methyl group, an ethyl group, or an isopropyl group each of $R^{1d}$ and $R^{1e}$ is independently a fluorine atom, an alkyl group which is $C_{1-6}$ straight-chain, $C_{3-6}$ branched-chain, or $C_{3-6}$ cyclic, or an aryl group which is $C_{6-15}$, in the alkyl group or aryl group, a part of or all of hydrogen atoms may be replaced with fluorine atom, a part of carbon atoms may be replaced with oxygen atom or nitrogen atom, and $R^{1f}$ is a methyl group, an ethyl group, or an isopropyl group.

2. The curable composition as claimed in claim 1, wherein the silane compound containing Si—H group is a silane compound represented by the formula (5-5), (5-8), or (5-9).

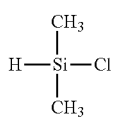

(5-5)

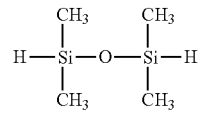

(5-8)

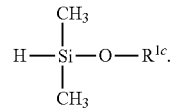

(5-9)

3. The curable composition as claimed in claim 1, wherein the silane compound containing Si—CH=CH$_2$ group is a silane compound represented by the formula (7-5), (7-7), or (7-8).

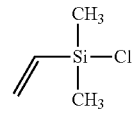

(7-5)

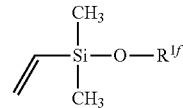

(7-7)

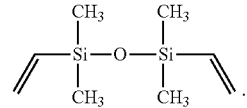

(7-8)

4. A cured product made by curing the curable composition as claimed in claim 1.

5. A sealing material made by using the cured product as claimed in claim 4.

6. A method for producing a cured product wherein the curable composition as claimed claim 1 is cured by heating to 70° C. or higher and 300° C. or lower.

* * * * *